United States Patent
Huang et al.

(10) Patent No.: US 11,408,692 B2
(45) Date of Patent: Aug. 9, 2022

(54) LIQUID COOLING DEVICE, COOLANT CIRCULATION SYSTEM AND LIQUID LEAKAGE DETECTING METHOD

(71) Applicant: GIGA-BYTE TECHNOLOGY CO., LTD., New Taipei (TW)

(72) Inventors: Shun-Chih Huang, New Taipei (TW); Tai-Chuan Mao, New Taipei (TW); Ching-Yu Lu, New Taipei (TW); Yi-Jhen Lin, New Taipei (TW); Liang-Yu Wu, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 120 days.

(21) Appl. No.: 16/425,983

(22) Filed: May 30, 2019

(65) Prior Publication Data
US 2019/0368832 A1    Dec. 5, 2019

(30) Foreign Application Priority Data

May 31, 2018   (TW) ................................. 107118826
Dec. 6, 2018   (TW) ................................. 107144005

(51) Int. Cl.
*F28F 27/00*    (2006.01)
*H05K 7/20*     (2006.01)
*G01M 3/16*     (2006.01)

(52) U.S. Cl.
CPC .............. *F28F 27/00* (2013.01); *G01M 3/16* (2013.01); *H05K 7/20272* (2013.01); *H05K 7/20281* (2013.01); *F28F 2265/16* (2013.01)

(58) Field of Classification Search
CPC .. F28F 2265/16; F28F 27/00; H05K 7/20272; H05K 7/20281; G01M 3/16
(Continued)

(56) References Cited

U.S. PATENT DOCUMENTS 4,870,477 A * 9/1989 Nakanishi ............. H01L 23/433
                                                    257/713
4,922,232 A * 5/1990 Bosich .................. G01M 3/045
                                                    200/61.04
(Continued)

FOREIGN PATENT DOCUMENTS

TW          M568025 U   * 10/2018

OTHER PUBLICATIONS

TWM568025U English Machine Translation (Year: 2018).*

*Primary Examiner* — Jenna M Hopkins
(74) *Attorney, Agent, or Firm* — Idea Intellectual Limited; Margaret A. Burke; Sam T. Yip

(57) ABSTRACT

A liquid cooling device includes a liquid cooling conductor, a detecting probe, and a determining circuit. The liquid cooling conductor includes a chamber defined therein for communicating with the outside, the chamber is configured to accommodate the coolant, and the surface of the liquid cooling conductor is provided with at least one communicating port communicating with the chamber; wherein the liquid cooling conductor is formed joining at least two combination blocks, and at least one of the two combination blocks is a metal conductor. The detecting probe is disposed on the liquid cooling conductor and normally electrically disconnected from the metal conductor. The determining circuit is electrically connected to the metal conductor and the detecting probe, and generates a liquid leakage alarm signal when the metal conductor and the detecting probe are electrically connected.

18 Claims, 18 Drawing Sheets

(58) Field of Classification Search
USPC ............................................ 165/11.1
See application file for complete search history.

(56) References Cited

U.S. PATENT DOCUMENTS

| | | | | |
|---|---|---|---|---|
| 5,086,829 | A * | 2/1992 | Asakawa | H05K 7/20281 165/104.33 |
| 5,121,929 | A * | 6/1992 | Cobb | F16J 15/064 277/317 |
| 5,172,730 | A * | 12/1992 | Driver | G01M 3/18 138/104 |
| 5,865,971 | A * | 2/1999 | Sunkara | F16J 15/064 204/280 |
| 5,918,267 | A * | 6/1999 | Evans | G01M 3/165 174/11 R |
| 6,026,862 | A * | 2/2000 | Friedrich | G01M 3/28 138/112 |
| 6,787,718 | B2 * | 9/2004 | Andberg | G01M 3/165 200/61.04 |
| 6,826,948 | B1 * | 12/2004 | Bhatti | G01M 3/188 340/605 |
| 7,009,409 | B2 * | 3/2006 | Davie | F16J 15/061 324/658 |
| 7,096,725 | B2 * | 8/2006 | Vialard | F02B 77/085 72/115 |
| 7,142,425 | B2 * | 11/2006 | Tomioka | G06F 1/203 361/699 |
| 7,430,896 | B2 * | 10/2008 | Shiozawa | G06F 1/1635 73/40 |
| 7,568,516 | B2 * | 8/2009 | Bergqvist | F16J 15/064 165/11.1 |
| 8,087,430 | B1 * | 1/2012 | Betz | G01M 3/18 138/104 |
| 8,696,723 | B2 * | 4/2014 | Stelea | A61F 7/10 607/88 |
| 8,897,013 | B2 * | 11/2014 | Sharaf | H05K 7/20509 361/702 |
| 9,052,252 | B2 * | 6/2015 | Lyon | G01M 3/18 |
| 9,400,227 | B2 * | 7/2016 | Ramos | E21B 17/015 |
| 9,739,546 | B2 * | 8/2017 | Bertilsson | F28F 3/10 |
| 9,829,259 | B2 * | 11/2017 | Nyander | F28F 3/00 |
| 10,364,809 | B2 * | 7/2019 | Lyon | G01M 3/2807 |
| 2002/0036078 | A1 * | 3/2002 | Janezich | F28F 9/06 165/164 |
| 2004/0188069 | A1 * | 9/2004 | Tomioka | G06F 1/206 165/104.33 |
| 2012/0251859 | A1 * | 10/2012 | Payne | H01M 10/4228 429/90 |
| 2013/0206359 | A1 * | 8/2013 | Bertilsson | G01M 3/40 165/11.1 |
| 2013/0233508 | A1 * | 9/2013 | Cederberg | F28F 3/10 165/11.1 |
| 2014/0251583 | A1 * | 9/2014 | Eriksen | F28F 3/12 165/104.33 |
| 2014/0266744 | A1 * | 9/2014 | Lyon | G01M 3/165 340/605 |
| 2015/0168474 | A1 * | 6/2015 | Yoshioka | B60L 50/51 702/58 |
| 2016/0178475 | A1 * | 6/2016 | Krishnan | H05K 7/20772 324/713 |
| 2016/0281704 | A1 * | 9/2016 | Lyon | G05B 17/02 |
| 2019/0368832 | A1 * | 12/2019 | Huang | G01M 3/185 |
| 2020/0025641 | A1 * | 1/2020 | Long | H05K 7/20254 |
| 2020/0340767 | A1 * | 10/2020 | Holden | H05K 7/20272 |

* cited by examiner

LIQUID COOLING DEVICE, COOLANT CIRCULATION SYSTEM AND LIQUID LEAKAGE DETECTING METHOD

CROSS-REFERENCES TO RELATED APPLICATIONS

This non-provisional application claims priority under 35 U.S.C. § 119(a) to Patent Application No. 107118826 and 107144005, filed in Taiwan, R.O.C. on May 31, 2018 and Dec. 6, 2018, the entire contents of which are hereby incorporated by reference.

BACKGROUND

Technical Field

This disclosure relates to a liquid cooling system for an electronic device, particularly to a liquid cooling device, a coolant circulation system and a liquid leakage detecting method.

Related Art

As the power consumption of computer chips is increasingly high, heat dissipation means such as air cooling and heat pipes have gradually failed to cope with the heat generated during the operation of central processing units or graphics processing units. Especially for an over-clocking computer, if the heat is not effectively dissipated, the protection mechanism of the computer device is activated to reduce the operating frequency of the central processing unit, the graphics processing unit and even the memory.

A liquid cooling system is able to quickly remove a large amount of heat, and is used as effective heat dissipation means. For a liquid cooling conductor (as known as water cooled head), it should have a chamber inside for the circulation of coolant, and is at least partially made of a high thermally-conductive metal. Therefore, the liquid cooling conductor is formed by connecting at least two assemblies, and a seam is formed between the two assemblies. The seam will leak liquid after the sealant is deteriorated, regardless of whether watertight treatment is performed or not. In addition, the coolant in the chamber needs to be circulated continuously between the chamber and a reservoir to ensure that the coolant in the chamber remains cold. The pipe joint connecting the chamber also forms another possible leak point.

The coolant is typically based on reverse osmosis pure water and provided with appropriate additives. Whether the coolant is pure water or contains additives, it still has certain conductivity even its resistance is high. Once the liquid leaks and flows to the circuit around the chip, a short circuit is caused to damage the computer device. However, the liquid leakage phenomenon occurs inside a computer case, and often cannot be found in time to stop the computer host to avoid the short circuit. Even a liquid pump that provides the liquid cooling cycle is still in operation after the liquid leaks, so that the liquid leakage accelerates and aggravates, and the liquid leakage phenomenon is more difficult to discover in time.

SUMMARY

This disclosure provides a liquid cooling device, a coolant circulation system and a liquid leakage detecting method, which can detect liquid leakage and generate a liquid leakage alarm signal forthwith to shut down the operation of necessary components.

This disclosure provides a liquid cooling device comprising a liquid cooling conductor, a detecting probe, and a determining circuit. The liquid cooling conductor includes a chamber defined therein for communicating with outside, the chamber is configured to accommodate a coolant, and the surface of the liquid cooling conductor is provided with at least one communicating port communicating with the chamber; wherein the liquid cooling conductor is formed by joining at least two combination blocks, and at least one of the at least two combination blocks is a metal conductor. The detecting probe is disposed on the liquid cooling conductor and normally electrically disconnected from the metal conductor. The determining circuit is electrically connected to the metal conductor and the detecting probe, and generates a liquid leakage alarm signal when the metal conductor and the detecting probe are electrically connected.

In one or more embodiments, a seam is formed between the at least two combination blocks, and the detecting probe is disposed beside the seam; or the detecting probe surrounds the at least one communicating port.

In one or more embodiments, one of the at least two combination blocks is a metal conductor, the other combination block is an insulator, and the detecting probe is disposed on the insulator without contacting the metal conductor; or the at least two combination blocks are metal conductors, and the liquid cooling device further comprises an insulating patch attached to the metal conductor, and the detecting probe is attached to the insulating patch.

In one or more embodiments, the liquid cooling device further includes a sealing member surrounding the seam or the communicating port and located inside the detecting probe.

In one or more embodiments, the liquid cooling device further includes another sealing member surrounding the seam or the communicating port and located outside the detecting probe.

In one or more embodiments, the another sealing member is a conductive rubber ring.

In one or more embodiments, the conductive rubber ring is electrically connected to the detecting probe.

In one or more embodiments, the liquid cooling device further includes a capillary structure, disposed between the detecting probe and the sealing member.

In one or more embodiments, the capillary structure is made of absorbent material.

In one or more embodiments, wherein the capillary structure is surface structure formed on a surface of the insulator.

In one or more embodiments, wherein the surface structure covers the surface of the insulator excepting the part disposing the sealing member.

In one or more embodiments, wherein the surface structure is hairline texture, and at least includes two sets of directional interleaving hairlines.

In one or more embodiments, wherein the detecting probe is attached on the surface structure.

In one or more embodiments, wherein the capillary structure includes absorbent material and a surface structure formed on a surface of the insulator.

In one or more embodiments, wherein the detecting probe is configured into a capillary structure, and the detecting probe covers the surface of the insulator excepting the part disposing the sealing member.

In one or more embodiments, the liquid cooling conductor is formed by joining at least three combination blocks, and the three combination blocks comprise at least one metal conductor, a first insulator and a second insulator; the first insulator includes a through hole and a first trough, the first trough is located on a first side of the first insulator, and the through hole communicates with the first trough and a second side of the first insulator; the second insulator is joined to the first side of the first insulator to cover the first trough; and the metal conductor is joined to the second side of the first insulator to cover the through hole, so that the first trough and the through hole are sealed to form the chamber.

In one or more embodiments, a second trough is formed on a side of the second insulator facing the first trough to increase the volume of the chamber.

In one or more embodiments, wherein the communicating port extends from the outer surface of the second insulator to the second trough and communicates with the chamber through the second trough; or the communicating port penetrates the solid portions of the first insulator and the second insulator from the outer surface of the second insulator to be communicated to the second side of the first insulator.

In one or more embodiments, wherein the second side of the first insulator is provided with a fourth trough corresponding to the communicating port.

In one or more embodiments, wherein the metal conductor further comprises a third trough, the metal conductor is joined to the second side of the first insulator, and the third trough faces the through hole.

This disclosure provides also provides a coolant circulation system, comprising the liquid cooling device, a liquid pump, and driving circuit. The liquid pump is connected to the at least one communicating port by a pipe. The driving circuit is electrically connected to the liquid pump and the determining circuit for driving the liquid pump, and shutting down the liquid pump when receiving the liquid leakage alarm signal from the determining circuit.

In one or more embodiment, the coolant circulation system further comprises a reservoir, wherein the liquid pump is connected to the communicating port and the reservoir by the pipe.

In one or more embodiment, the coolant circulation system further comprises an alarm electrically connected to the determining circuit, and the alarm receives the liquid leakage alarm signal to generate a corresponding alarm message.

This disclosure provides also provides a liquid leakage detecting method, comprising: disposing a detecting probe beside a seam, or disposing the detecting probe around at least one communicating port, wherein the seam is formed on a liquid cooling conductor by joining at least two combination blocks, and the at least one communicating port communicates with the interior of the liquid cooling conductor; providing a first detecting potential for the detecting probe, and providing a second detecting potential for a metal conductor on the liquid cooling conductor; and determining whether the detecting probe and the metal conductor are electrically connected, and generating a liquid leakage alarm signal when the detecting probe and the metal conductor are electrically connected.

In one or more embodiment, the step of disposing a detecting probe beside a seam comprises: disposing the detecting probe at an insulator portion of the liquid cooling conductor.

The detecting probe and the metal conductor of the liquid cooling conductor are used as liquid leakage probes, and a relatively simple trigger circuit can be used as the determining circuit, so that the liquid leakage alarm function can be integrated into a portion of the existing liquid cooling device, without a complicated detecting system or changing of the structure of the liquid cooling conductor. In addition, the liquid leakage alarm signal can be used for shutting down the liquid pump in real time to avoid the continuous occurrence of leakage from destroying surrounding electronic components, and real-time intervention of a user is not required, so that this disclosure has a liquid leakage protection function.

DETAILED DESCRIPTION

Figure 1:
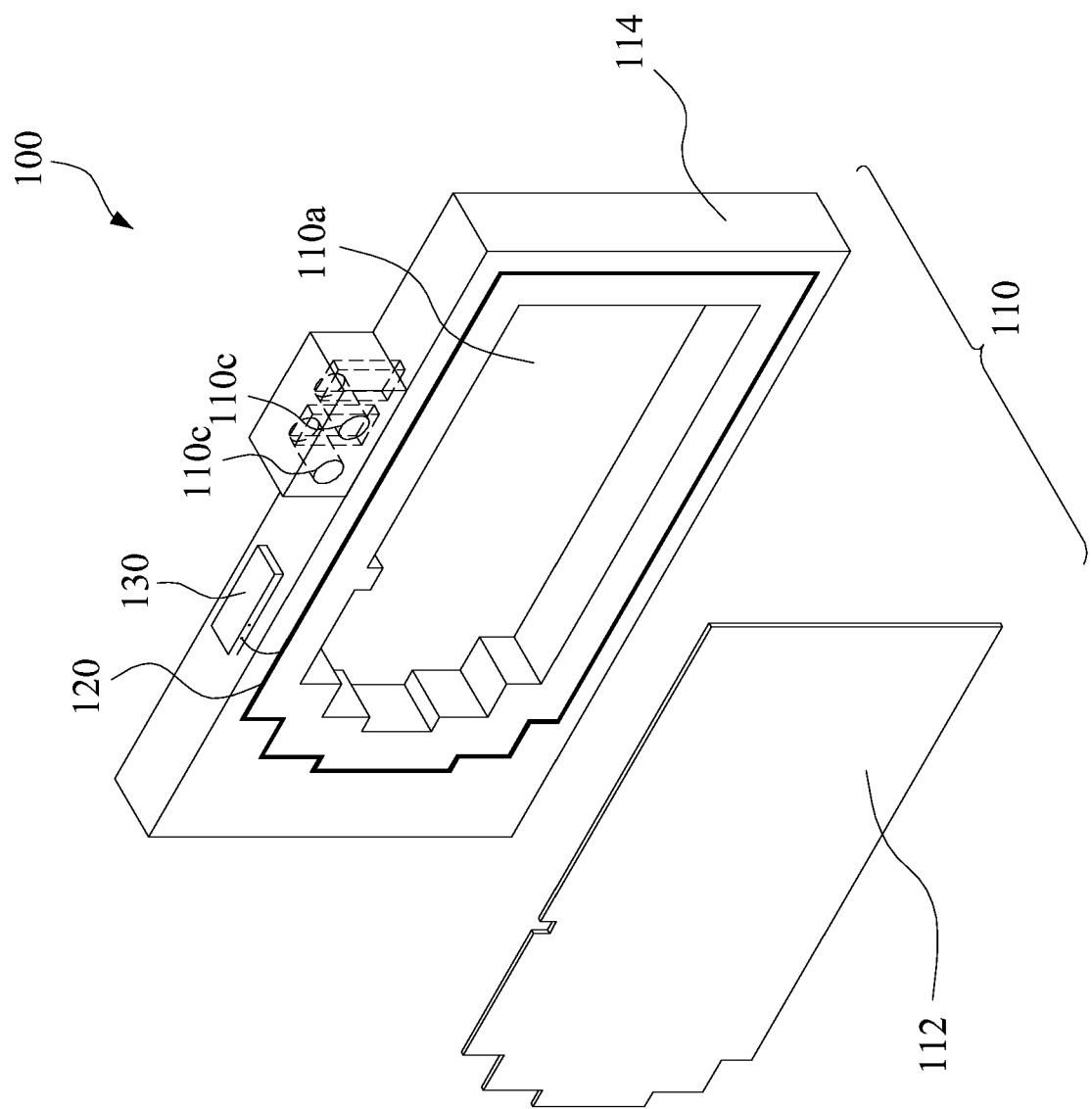
FIG. 1 is an exploded three-dimensional view of a liquid cooling device according to a first embodiment of this disclosure.
Figure 2:
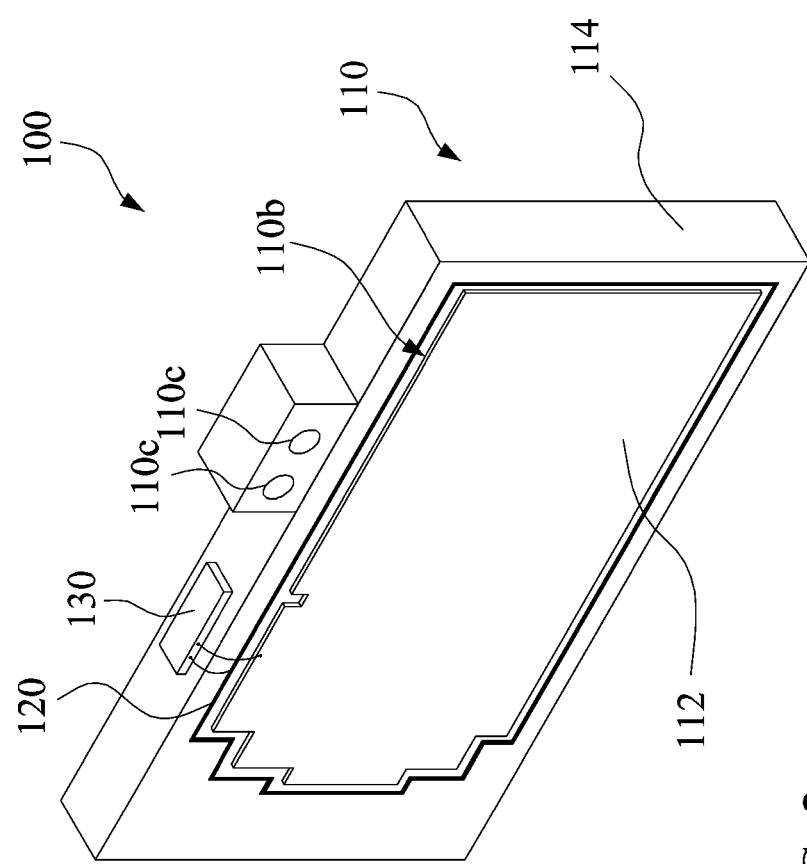
FIG. 2 is a three-dimensional view of the liquid cooling device according to the first embodiment of this disclosure.

Referring to FIG. 1 and FIG. 2, which show a liquid cooling device 100 according to a first embodiment of this disclosure. The liquid cooling device 100 is configured to contact a heat source and provide a coolant to circulate inside the liquid cooling device 100, so as to cool the heat source quickly. The heat source may be, but not limited to, a high-power electronic chip such as a central processing unit (CPU) or a graphics processing unit (GPU).

As shown in FIG. 1 and FIG. 2, the liquid cooling device 100 includes at least one liquid cooling conductor 110, a detecting probe 120, and a determining circuit 130.

As shown in FIG. 1, the liquid cooling conductor 110 includes a chamber 110a defined therein for communicating with the outside, so as to allow an external coolant to flow therein and accommodate the coolant. Based on the limitations of machining techniques, the liquid cooling conductor 110 is generally formed by joining two or more combination blocks to form the chamber 110a. Meanwhile, in order to serve as a good heat transfer medium, at least one of the combination blocks is a metal conductor 112 for contacting the heat source to rapidly transfer the heat generated by the heat source to the coolant in the chamber 110a. Taking the first embodiment as an example, one combination block is a metal conductor 112, and the other combination block is an insulator 114, such as a container-like structural member made of acrylic.

Certainly, it is not excluded that all of the combination blocks are metal conductors 112. A seam 110b is formed between two combination blocks in the liquid cooling conductor 110 formed by joining the at least two combination blocks. The seam 110b may cause leakage to damage surrounding circuits. In addition, the coolant flowing in the chamber 110a is continuously circulated and exchanged with an external cooler or cooling water tank. Therefore, the surface of the liquid cooling conductor 110 is further provided with one or more communicating ports 110c communicating with the chamber 110a such that the chamber 110a is connected to a circulation device 200 by a pipe 230 (see FIG. 7). In the first embodiment, the surface of the liquid cooling conductor 110 is provided with two communicating ports 110c communicating with the chamber 110a, one of the communicating ports 110c is configured for the coolant to flow from a reservoir 210 such as a cooler or a cooling water tank to the chamber 110a, and the other communicating port 110c is configured for the coolant absorbing the heat to leave the chamber 110a and return to the reservoir 210 for cooling. A seam 110b that may leak liquid is also formed around the communicating port 110c.

As shown in FIG. 1 and FIG. 2, the detecting probe 120 is disposed on the liquid cooling conductor 110, and is normally electrically disconnected from the metal conductor 112. In the first embodiment, the other combination block is an insulator 114. Thus, the detecting probe 120 can be directly disposed on the insulator 114 without contact the metal conductor 112, so that the detecting probe 120 can be normally electrically disconnected from the metal conductor 112.

As shown in FIG. 1 and FIG. 2, the insulator 114 of the liquid cooling conductor 110 has a trough machined by turn-milling, such that the insulator 114 is a container-like member. The metal conductor 112 is a plate, and can seal the trough to form the chamber 110a. As shown in FIG. 2, the metal conductor 112 partially covers the surface of the insulator 114. In this case, the detecting probe 120 is ideally disposed on the surface of the insulator 114, and surrounds the metal conductor 112 but does not contact the metal conductor 112, for example, the detecting probe 120 is disposed in parallel beside the seam 110b.

In this case, the seam 110b is located at the edge of the metal conductor 112, regardless of the arrangement direction of the liquid cooling conductor 110 (the arrangement direction of the liquid cooling conductor 110 meets the requirement of contact between the metal conductor 112 and the heat source), and the leaking coolant can flow outward and contact the detecting probe 120, so that the detecting probe 120 is electrically connected to the metal conductor 112 through the coolant.

Figure 3:
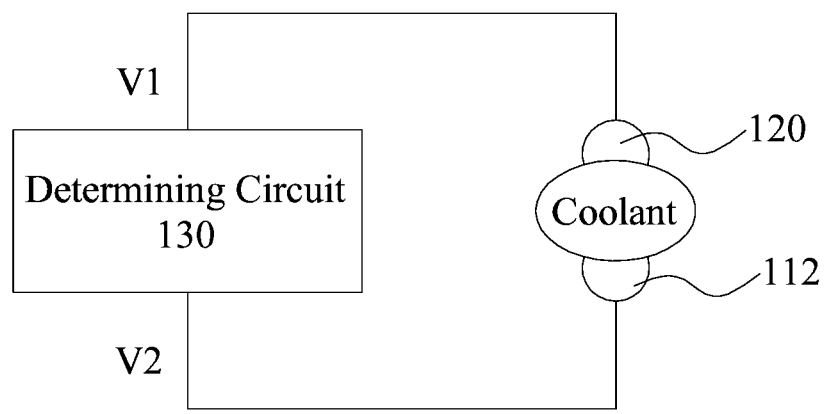
FIG. 3 is a circuit diagram of the liquid cooling device according to the first embodiment of this disclosure.

As shown in FIG. 2 and FIG. 3, the determining circuit 130 is electrically connected to the metal conductor 112 and the detecting probe 120 for generating a liquid leakage alarm signal when the metal conductor 112 and the detecting probe 120 are electrically connected. In an example, the determining circuit 130 applies a potential difference to the detecting probe 120 and the metal conductor 112, for example, a first detecting potential V1 is applied to the detecting probe 120, the metal conductor 112 is electrically grounded as a second detecting potential V2, and a potential difference of subtracting V2 from V1 is thus formed. The determining circuit 130 determines whether current is generated between the detecting probe 120 and the metal conductor 112. The coolant normally contacts the metal conductor 112 in the chamber 110a. If the leaking coolant contacts the detecting probe 120, the detecting probe 120 and the metal conductor 112 are electrically connected through the leaking coolant to generate current, thereby triggering the determining circuit 130 to generate a liquid leakage alarm signal. The circuit shown in FIG. 3 is one of the implementations of current detection, but the detecting means for determining whether the electrode 120 and the metal conductor 112 are electrically connected is not limited to the disclosure of FIG. 3.

Figure 4:
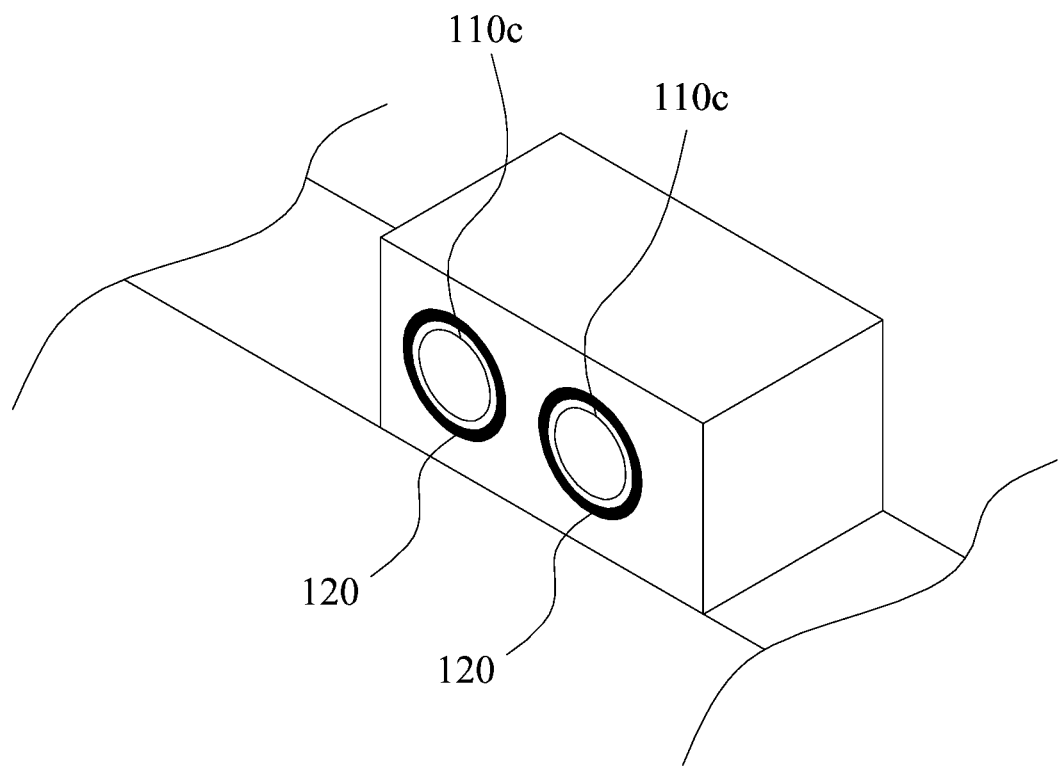
FIG. 4 is an enlarged three-dimensional view of partial components of the liquid cooling device according to the first embodiment of this disclosure.

Referring to FIG. 4, a seam 110b that may leak liquid is also formed around the communicating port 110c. Therefore, in the first embodiment, another detecting probe 120 is disposed on the combination block to surround at least one communicating port 110c. If the seam 110b around the communicating port 110c leaks coolant, the detecting probe 120 and the metal conductor 112 are also conducted to trigger the determining circuit 130 to generate a liquid leakage alarm signal.

Figure 5:
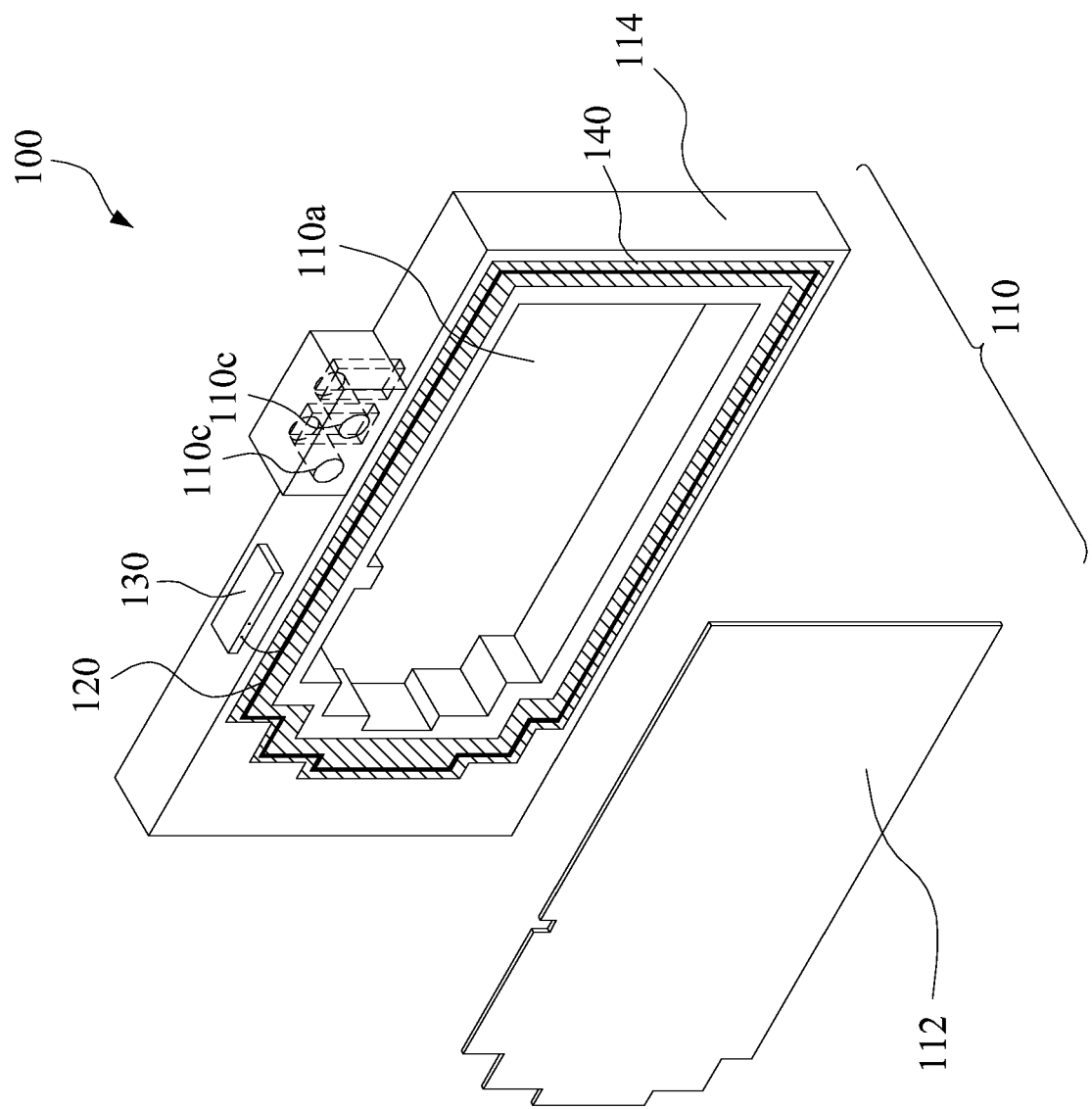
FIG. 5 is an exploded three-dimensional view of the liquid cooling device according to a second embodiment of this disclosure.

As shown in FIG. 5, the combination blocks of the liquid cooling conductor 110 according to a second embodiment are all metal conductors 112. Thus, the liquid cooling device 100 further includes an insulating patch 140 attached to one of the metal conductors 112, and the detecting probe 120 is attached to the insulating patch 140, so that the detecting probe 120 is disposed on the liquid cooling conductor 110 and normally electrically disconnected from the metal conductor 112 through the insulating patch 140.

Figure 6:
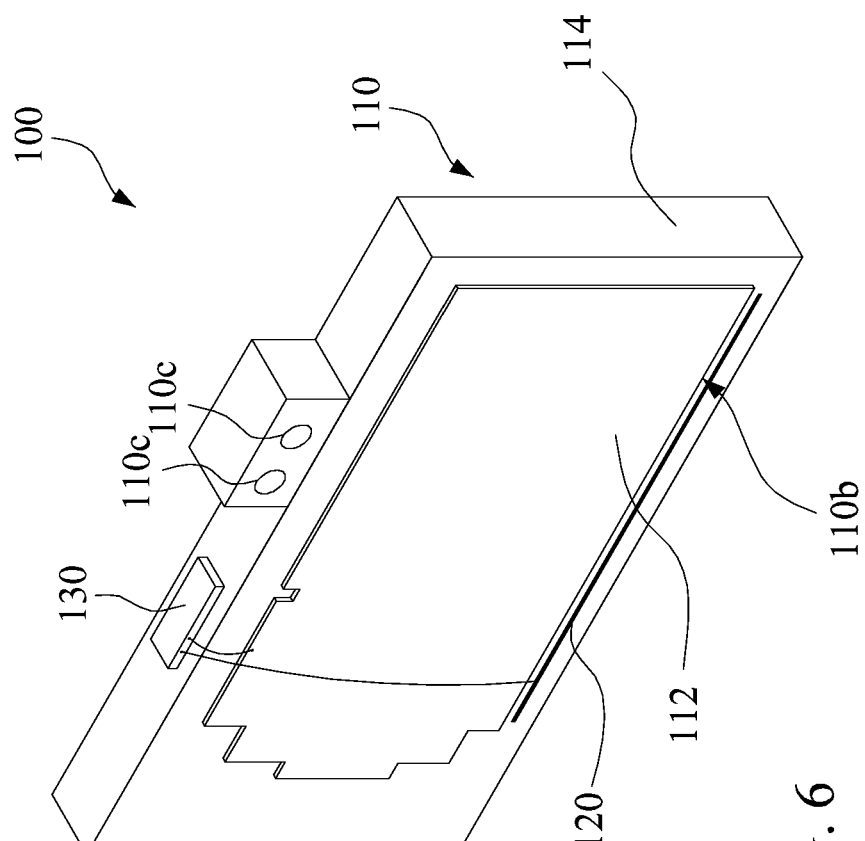
FIG. 6 is a three-dimensional view of the liquid cooling device according to a third embodiment of this disclosure.

Referring to FIG. 6, which shows a liquid cooling device 100 according to a third embodiment of this disclosure. The liquid cooling device 100 according to the third embodiment also includes at least one liquid cooling conductor 110, a detecting probe 120 and a determining circuit 130.

As shown in FIG. 6, the detecting probe 120 does not need to continuously extend to surround the liquid cooling conductor 110. The leaking coolant usually flows downward with gravity. The detecting probe 120 is ideally located below the seam 110b, and is as close as possible to the seam 110b without surrounding to immediately contact the coolant as liquid leaks. That is, at least partial detecting probe 120 is located below the seam 110b in the direction of gravity. Thus, when the detecting probe 120 is disposed, it is necessary to consider the state in which the liquid cooling conductor 110 is actually mounted on the heat source, and to confirm the position of the seam 110b, so as to determine the position of the detecting probe 120.

In addition, the electrical conductivity of tap water is generally about 350 µS/cm, the electrical conductivity of reverse osmosis pure water is only 10 µS/cm. The electrical conductivity of the coolant regulated with additives and water may increase or decrease. Weak current or voltage conducted by the coolant under low electrical conductivity can be detected after moderate signal amplification. The distance between the detecting probe 120 and the seam 110b also needs to be shortened to shorten the conductive path between the detecting probe 120 and the metal conductor 112 to increase the current when conducting, so as to simplify the requirement of the determining circuit 130 for sensitivity to the detection of a conductive state.

Figure 7:
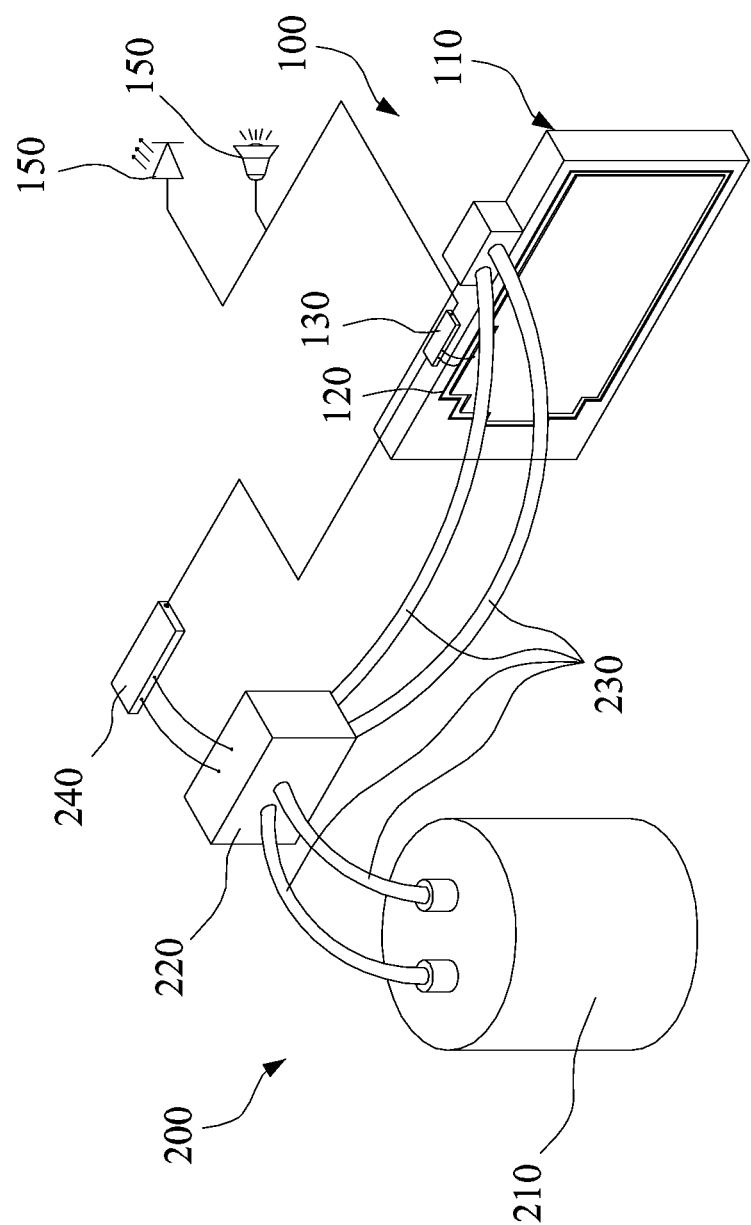
FIG. 7 is a three-dimensional view of a coolant circulation system according to a fourth embodiment of this disclosure.

Referring to FIG. 7, based on the foregoing embodiments, a fourth embodiment of this disclosure provides a coolant circulation system, including the liquid cooling device 100 as proposed in the foregoing embodiments and a circulation device 200. The liquid cooling device 100 includes a liquid cooling conductor 110, a detecting probe 120 and a determining circuit 130, the structure and the connection relationship of which are as described in the foregoing embodiments, and omitted here.

As shown in FIG. 7, the circulation device 200 includes a reservoir 210, a liquid pump 220, a pipe 230, and a driving circuit 240.

The liquid pump 220 is connected to the communicating port 110c and the reservoir 210 by the pipe 230 to pump the coolant to circulate between the chamber 110a of the liquid cooling conductor 110 and the reservoir 210.

The driving circuit 240 is electrically connected to the liquid pump 220 and the determining circuit 130 of the liquid cooling heat conducting device 100. The driving circuit 240 is configured to provide driving power to drive the liquid pump 220 to pump the coolant, and the driving circuit 240 shuts down the liquid pump 220 when receiving the liquid leakage alarm signal to stop pumping the coolant so as to avoid continuous liquid leakage.

The foregoing driving circuit 240 may be an independent circuit, directly gets power by a power supply of a computer host, and directly receives the liquid leakage alarm signal of the determining circuit 130 by a pin. The driving circuit 240 and the determining circuit 130 may also be bridged by an embedded board controller (EBC) of a computer motherboard; in this case, the liquid leakage alarm signal can be further transmitted to the motherboard in addition to the driving circuit 240, to generate alarm information by using a built-in function of an operating system or a loaded monitoring program to inform the user. Certainly, the driving circuit 240 and the determining circuit 130 may also be partially or completely integrated into the embedded controller as a part of the motherboard.

In addition, as shown in FIG. 7, the liquid cooling device 100 may further include an alarm 150, such as an indicator light device or an alarm sound device, electrically connected to the determining circuit 130. When liquid leaks and the determining circuit 130 sends a liquid leakage alarm signal, the alarm 150 can receive the liquid leakage alarm signal to generate corresponding alarm message, for example, the indicator light device emits indication light or the alarm sound device emits an alarm sound.

Figure 8:
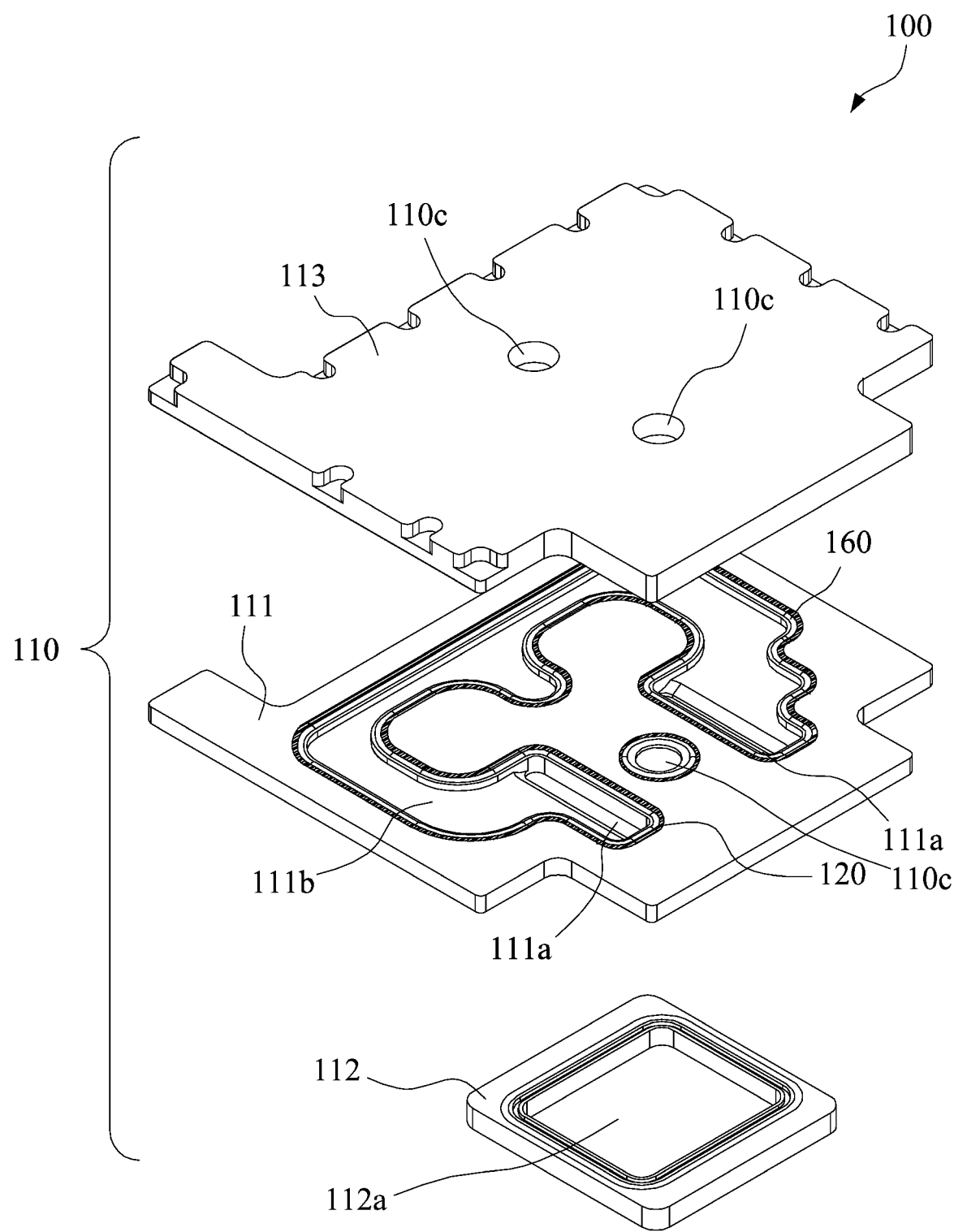
FIG. 8 and FIG. 9 are exploded three-dimensional views of the liquid cooling device according to a fifth embodiment of this disclosure.
Figure 9:
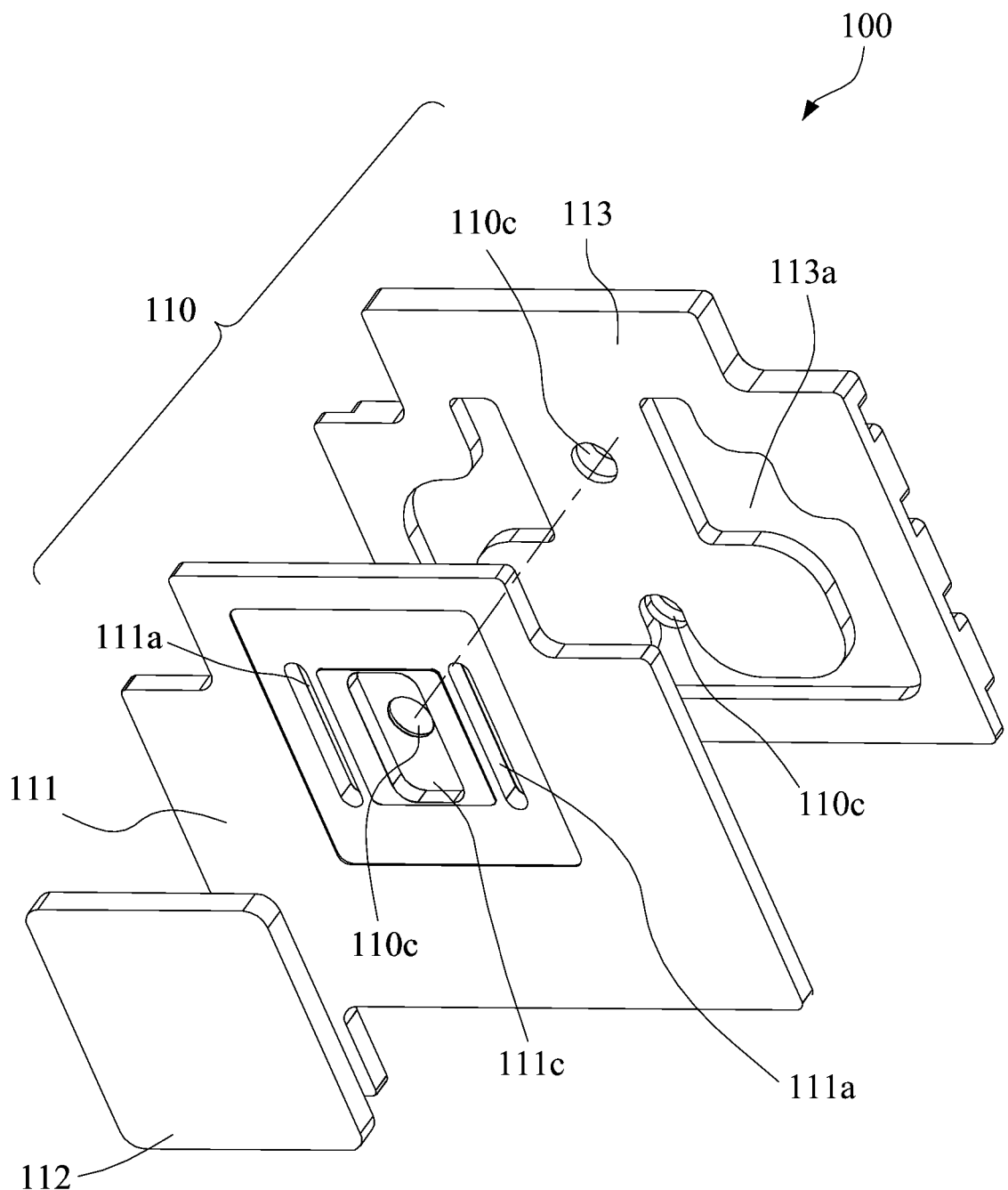
Figure 10:
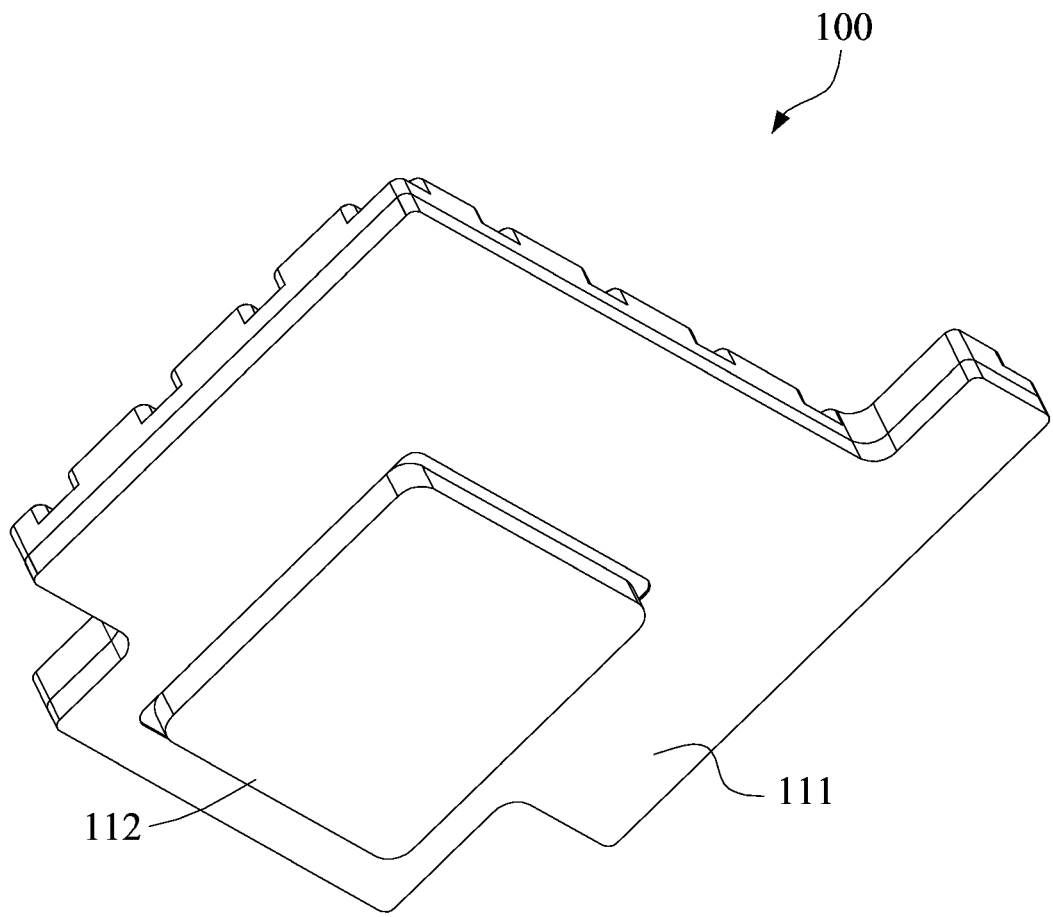
FIG. 10 is a three-dimensional view of the liquid cooling device according to the fifth embodiment of this disclosure.

Referring to FIG. 8, FIG. 9 and FIG. 10, which show a liquid cooling device 100 according to a fifth embodiment of this disclosure. The liquid cooling device 100 includes at least one liquid cooling conductor 110, a detecting probe 120, and a sealing member 160.

In the fifth embodiment, the liquid cooling conductor 110 is formed by joining three combination blocks. The three combination blocks include at least one metal conductor 112, a first insulator 111 and a second insulator 113. The first insulator 111 is substantially a plate having one or more through holes 111a and a first trough 111b. The first trough 111b is located on a first side of the first insulator 111, and the through hole 111a communicates with the first side and a second side of the first insulator 111. The second insulator 113 is joined to the first side of the first insulator 111 to cover the first trough 111b, and the through hole 111a communicates with the first trough 111b and the second side of the first insulator 111. The metal conductor 112 is joined to the second side of the first insulator 111 to cover the through hole 111a, so that the first trough 111b and the through hole 111a are sealed into a chamber 110a, and the coolant circulated in the chamber 110a can contact the metal conductor 112. The side of the second insulator 113 facing the first trough 111b may also be provided with a second trough 113a that is in the same projection shape as or is slightly larger than the first trough 111b, to increase the volume of the chamber 110a. In the fifth embodiment, the first trough 111b and the second trough 113a are U-shaped, and the two through holes 111a are respectively disposed corresponding to two ends of the U-shaped openings, so that the coolant flowing through the two through holes 111a can be sufficiently circulated to different portions of the U-shaped chamber 110a. Therefore, the chamber 110a includes the through hole 111a, the first trough 111b and the second trough 113a that communicate with each other. Or, it may also provide only the first trough 111b or the second trough 113a to form the chamber 110a separately.

As shown in FIG. 8 and FIG. 9, the metal conductor 112 is generally a metal plate, and is smaller than the second side of the first insulator 111 in area. The metal conductor 112 further includes a third trough 112a. The metal conductor 112 is joined to the second side of the first insulator 111, and the third trough 112a faces the through holes 111a. The third trough 112a can be used to increase the volume of the chamber 110a.

The second insulator 113 may be disposed at the communicating port 110c communicating with the chamber 110a. The communicating port 110c is configured for connecting the chamber 110a to the circulation device 200 by a pipe 230 (see FIG. 7). The communicating port 110c may extend from the outer surface of the second insulator 113 to the second trough 113a, and communicate with the chamber 110a through the second trough 113a. The communicating port 110c may also penetrate the solid portion of the second insulator 113 through the outer surface of the second insulator 113, and further penetrate the solid portion of the first insulator 111 to communicate with the third trough 112a of the metal conductor 112 and then communicate with the chamber 110a. The second side of the first insulator 111 may further be provided with a fourth trough 111c corresponding to the communicating port 110c to extend the volume of the chamber 110a.

Figure 11:
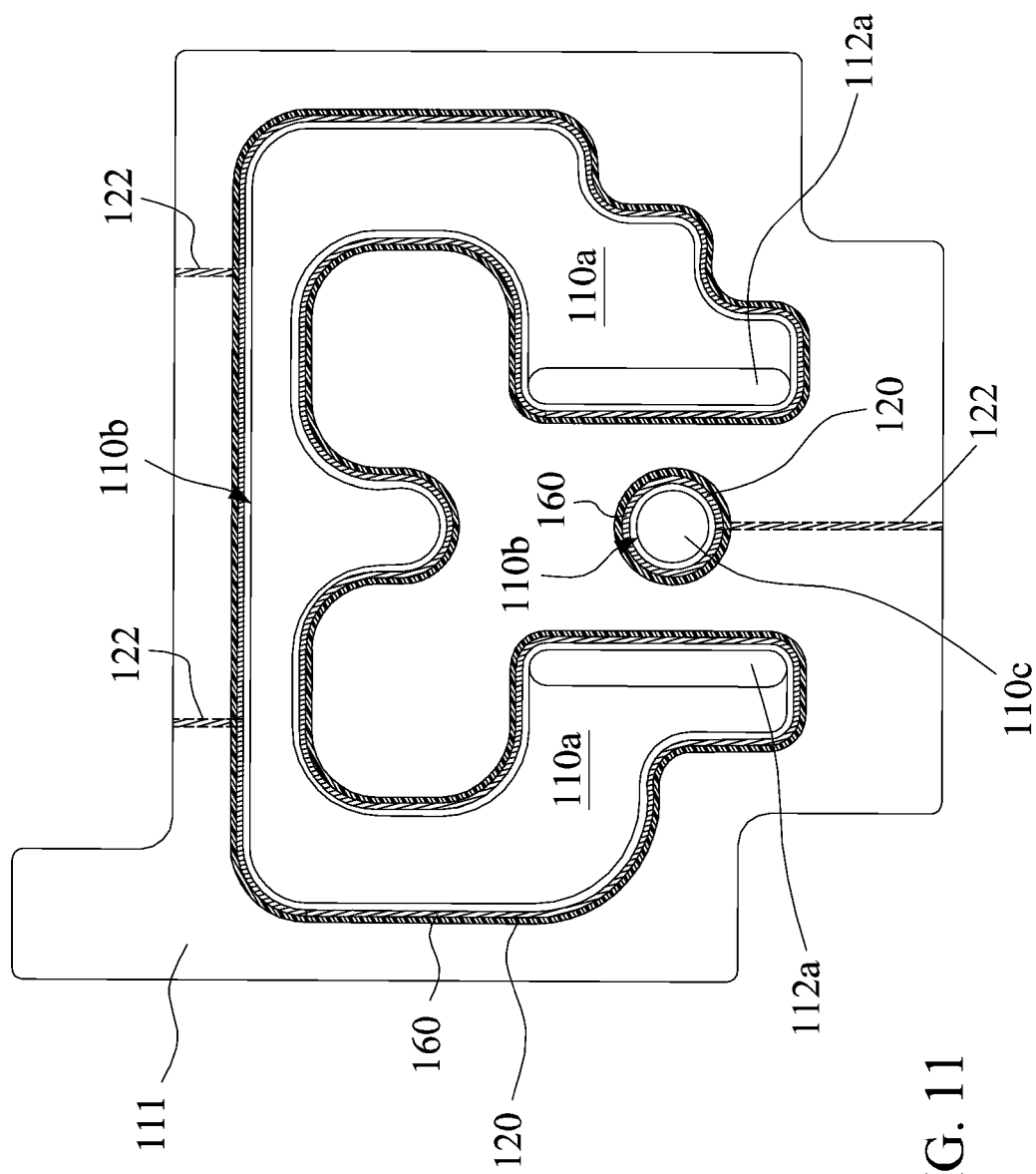
FIG. 11 is a top view of a first insulator according to the fifth embodiment of this disclosure.

As shown in FIG. 8 and FIG. 11, the detecting probe 120 is disposed on the liquid cooling conductor 110, and is normally electrically disconnected from the metal conductor 112. In the fifth embodiment, the first insulator 111 and the second insulator 113 are electrically insulated, and form a seam 110b along the boundary of the chamber 110a. Therefore, the detecting probe 120 may be disposed on the first insulator 111 or the second insulator 113 so as not to be in contact with the metal conductor 112, and the detecting probe 120 is normally electrically disconnected from the metal conductor 112.

As shown in FIG. 8 and FIG. 11, the detecting probe 120 is disposed on the first insulator 111 or the second insulator 113, surrounds the boundary of the second trough 113a, and is located outside the seam 110b. Substantially, each section of the detecting probe 120 is disposed in parallel beside the seam 110*b*. FIG. 11 shows an example in which the detecting probe 120 is disposed on the first insulator 111 (on the side of the first insulator 111 having the first trough 111*b*). The detecting probe 120 may be fabricated by printing a conductive paint and extends to form a wire segment 122. The wire segment 122 extends to a position that is not covered by the first insulator 111, e.g., the outer surface of the first insulator 111, to be exposed and thus can be connected to a supply source of the first detecting potential V1.

As shown in FIG. 8 and FIG. 11, the sealing member 160 may be a rubber ring or a soft annular patch, the shape of which is substantially the same as the projection shape of the detecting probe 120 or the seam 110*b*, but the size is slightly larger than the projection of the seam 110*b* and slightly smaller than the detecting probe 120. The sealing member 160 surrounds the seam 110*b* and is located inside the detecting probe 120, i.e., between the detecting probe 120 and the seam 110*b*. In general, when the sealing member 160 is a rubber ring, the first insulator 111 or the second insulator 113 may be provided with a groove corresponding to the rubber ring, so that the rubber ring is temporarily fixed to the first insulator 111 or the second insulator 113.

The sealing member 160 is configured to seal the joint interface of the first insulator 111 or the second insulator 113 to further seal the seam 110*b*, so as to prevent the seam 110*b* from leaking the coolant. After the sealing member 160 is aged and coolant leaks through the sealing member 160, the leaking coolant contacts the detecting probe 120 at first, so that the detecting probe 120 is electrically connected to the metal conductor 112 via the coolant. In this case, with the circuit of FIG. 3 or other detecting means for determining whether the detecting probe 120 and the metal conductor 112 are electrically connected, the liquid leakage alarm is immediately generated, and the operation of the circulation device 200 is stopped, thereby avoiding the damage of liquid leakage to the computer system.

As shown in FIG. 8 and FIG. 11, a seam 110*b* that may leak liquid is also formed around the communicating port 110*c*. Therefore, the detecting probe 120 may also surround the communicating port 110*c*. Similarly, a sealing member 160 surrounding the seam 110*b* is also disposed between the seam 110*b* around the communicating port 110*c* and the detecting probe 120. When the communicating port 110*c* penetrates the joint interface of the first insulator 111 or the second insulator 113, the communicating port 110*c* actually become a part of the chamber 110*a*, and the edge of the communicating port 110*c* passes through the joint interface to form the seam 110*b*.

The sealing member 160 is located inside the detecting probe 120 to seal the seam 110*b* around the communicating port 110*c*, so as to avoid leakage of the coolant around the communicating port 110*c*. If liquid leakage occurs, the detecting probe 120 and the metal conductor 112 are also electrically connected to trigger the determining circuit 130 to generate a liquid leakage alarm. As described above, if the first insulator 111 or the second insulator 113 is replaced with the metal conductor 112, the metal conductor 112 and the detecting probe 120 can be isolated by an insulating patch 140, so that the detecting probe 120 can be normally electrically disconnected from the metal conductor 112 by the insulating patch 140.

Figure 12:
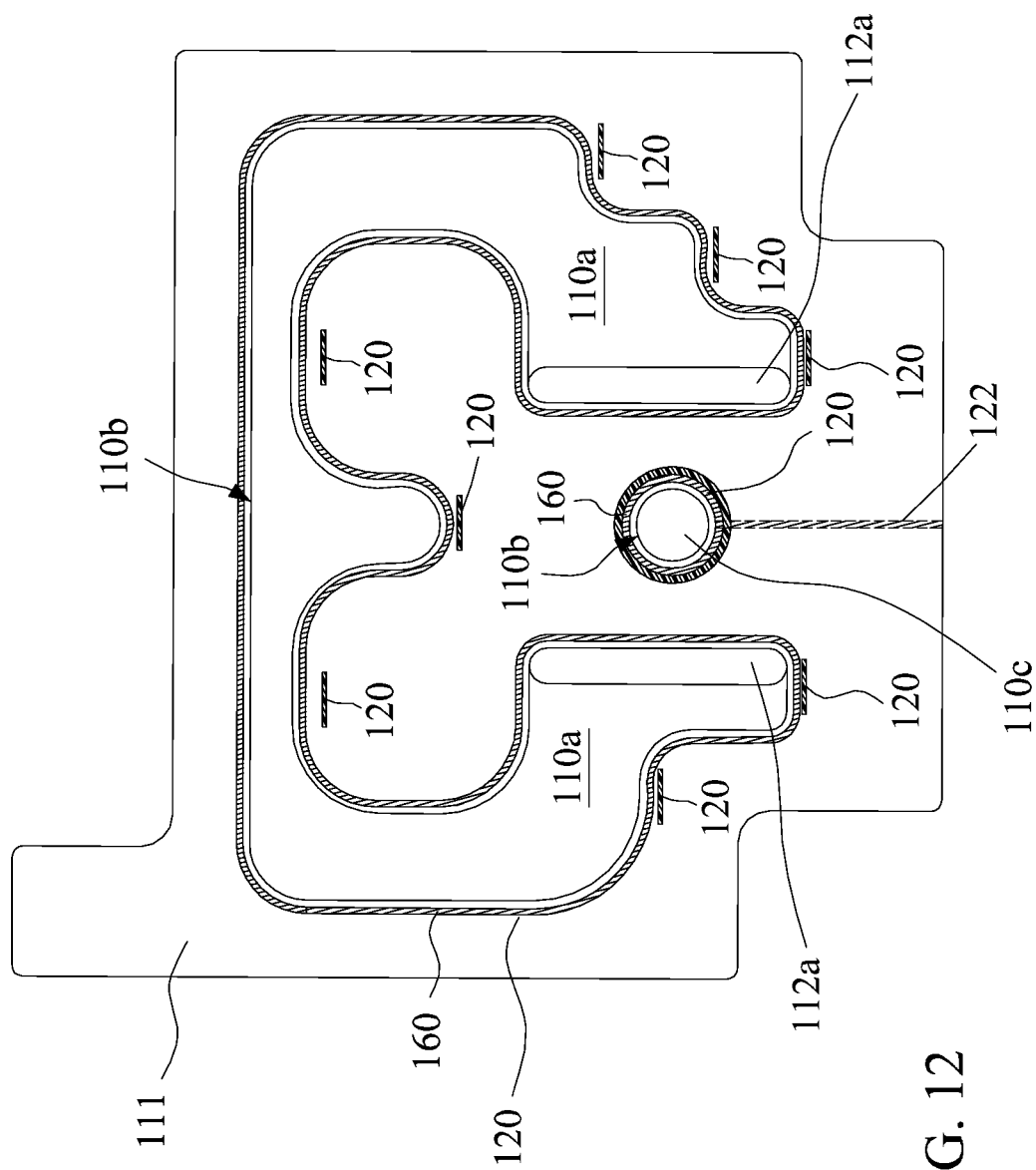
FIG. 12 is another top view of the first insulator according to the fifth embodiment of this disclosure.

Referring to FIG. 12, which is another top view of the first insulator 111 according to the fifth embodiment of this disclosure. FIG. 12 of the fifth embodiment is substantially the same as the fourth embodiment except that the detecting probe 120 does not continuously extend around the liquid cooling conductor 110 by a circle. Considering a state in which the liquid cooling conductor 110 is actually mounted on the heat source, after the position of the seam 110*b* is confirmed, the detecting probe 120 is partially disposed under the seam 110*b* and is as close as possible to the seam 110*b*. That is, the detecting probe 120 is partially located below the seam 110*b* in the direction of gravity. When liquid leakage occurs, the leaking coolant flows downward under the action of gravity to contact the detecting probe 120 below the seam 110*b*. In this embodiment, the sealing member 160 still surrounds the seam 110*b* and passes between the detecting probe 120 and the seam 110*b*.

Figure 13:
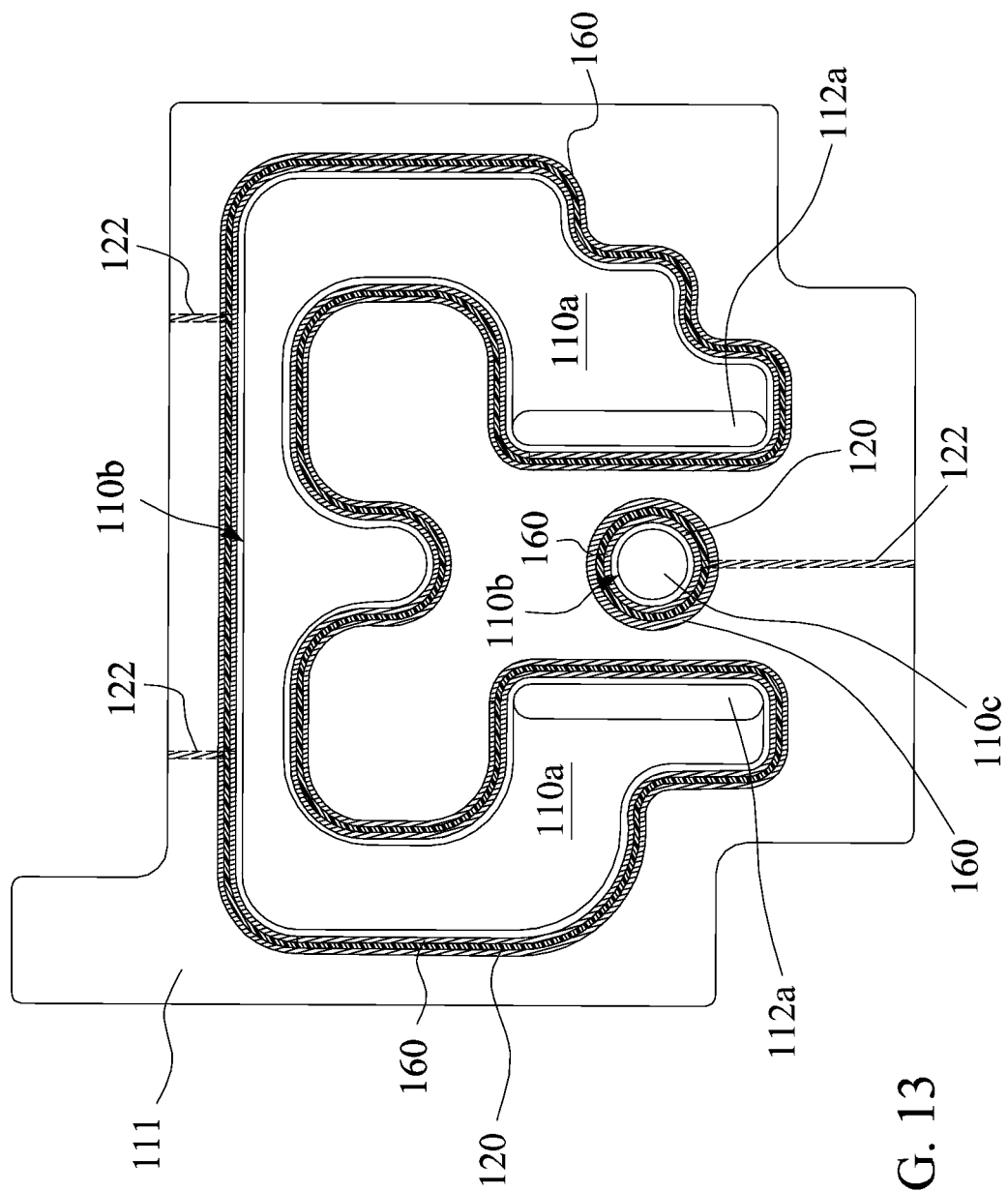
FIG. 13 is a top view of the first insulator according to a sixth embodiment of this disclosure.

Referring to FIG. 13, which is a top view of the first insulator 111 according to a sixth embodiment of this disclosure. The liquid cooling device 100 includes at least one liquid cooling conductor 110, a detecting probe 120, and a plurality of sealing members 160. The sixth embodiment is substantially the same as the fifth embodiment, and the differences are described below.

In the plurality of sealing members 160 (illustrated as two in FIG. 13), at least one sealing member 160 surrounds the seam 110*b* and is located between the seam 110*b* and the detecting probe 120, and at least another sealing member 160 surrounds the seam 110*b* and is located outside the detecting probe 120. Therefore, after the sealing member 160 on the inner ring is aged, the detecting probe 120 can detect the liquid leakage state immediately, and meanwhile, the sealing member 160 on the outer ring can be used as a backup means to prevent the leaking coolant from continuing to flow out. The detecting probe 120 according to the sixth embodiment of this disclosure can also be modified to discontinuously extend and not surround the liquid cooling conductor 110. That is, the detecting probe 120 is partially disposed under the seam 110*b* and located between two sealing members 160.

Figure 14:
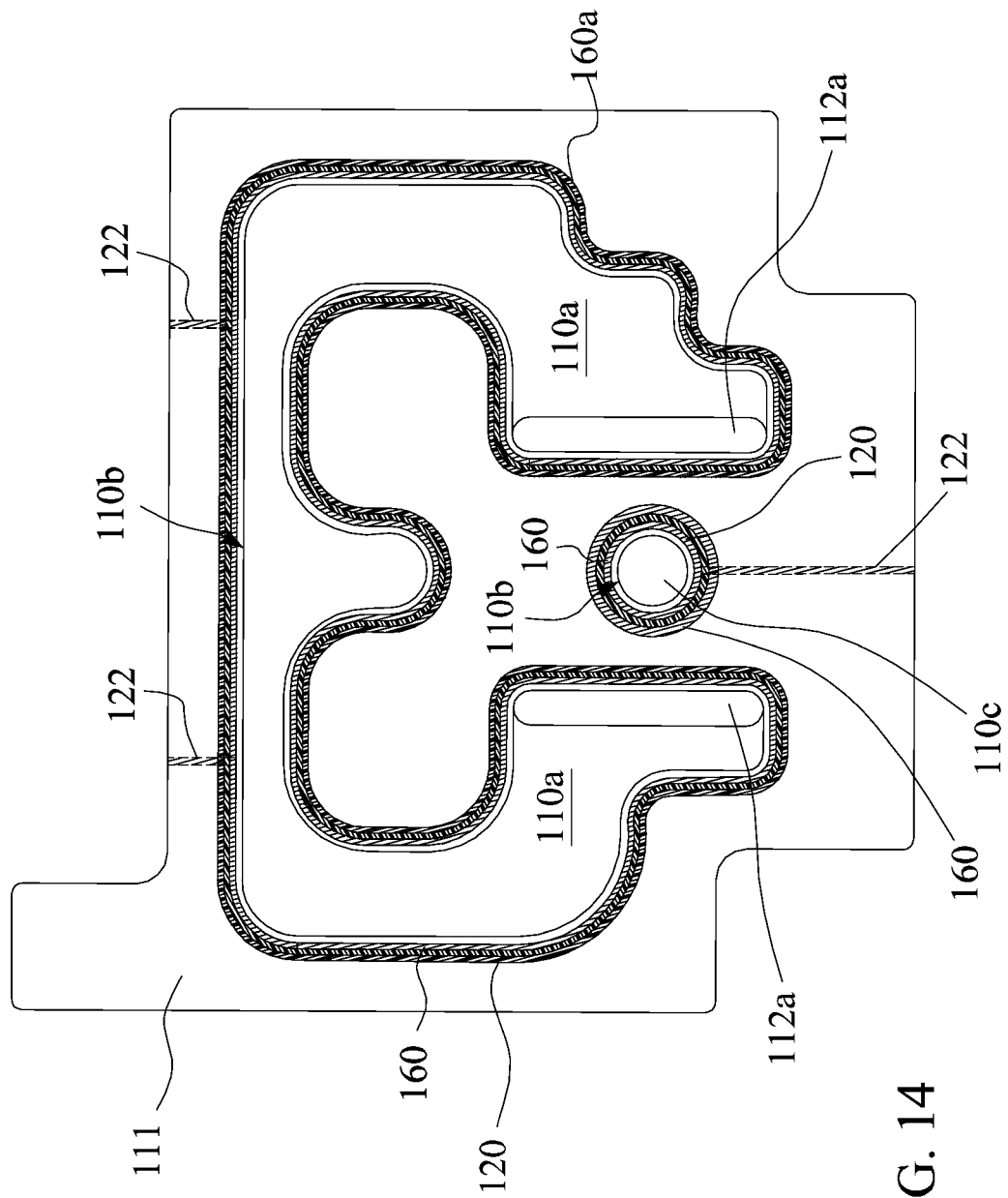
FIG. 14 is a top view of the first insulator according to a seventh embodiment of this disclosure.

Referring to FIG. 14, which is a top view of the first insulator 111 according to a seventh embodiment of this disclosure. The liquid cooling device 100 includes at least one liquid cooling conductor 110, a detecting probe 120, and a plurality of sealing members 160, 160*a*. The seventh embodiment is substantially the same as sixth embodiment, and the differences are described below.

In the plurality of sealing members 160, 160*a* (illustrated as two FIG. 14), at least one sealing member 160*a* is a conductive rubber ring, and is electrically connected to the detecting probe 120 or connected to the same detecting circuit together with the detecting probe 120. The conductive rubber ring as the sealing member 160*a* may be located outside the detecting probe 120. After the sealing member 160 on the inner ring is aged, the detecting probe 120 can detect the liquid leakage state immediately, and meanwhile, the sealing member 160*a* on the outer ring can be used as a backup sealing means to prevent the leaking coolant from continuing to flow out. In addition, the sealing member 160*a* on the outer ring is also a backup detecting means to avoid the failure of the detecting probe 120 due to various factors (e.g., poor conductivity caused by surface oxidation). The detecting probe 120 according to the seventh embodiment can also be modified to discontinuously extend and not surround the liquid cooling conductor 110. That is, the detecting probe 120 is partially disposed under the seam 110*b* and located between two sealing members 160, 160*a*.

Figure 15:
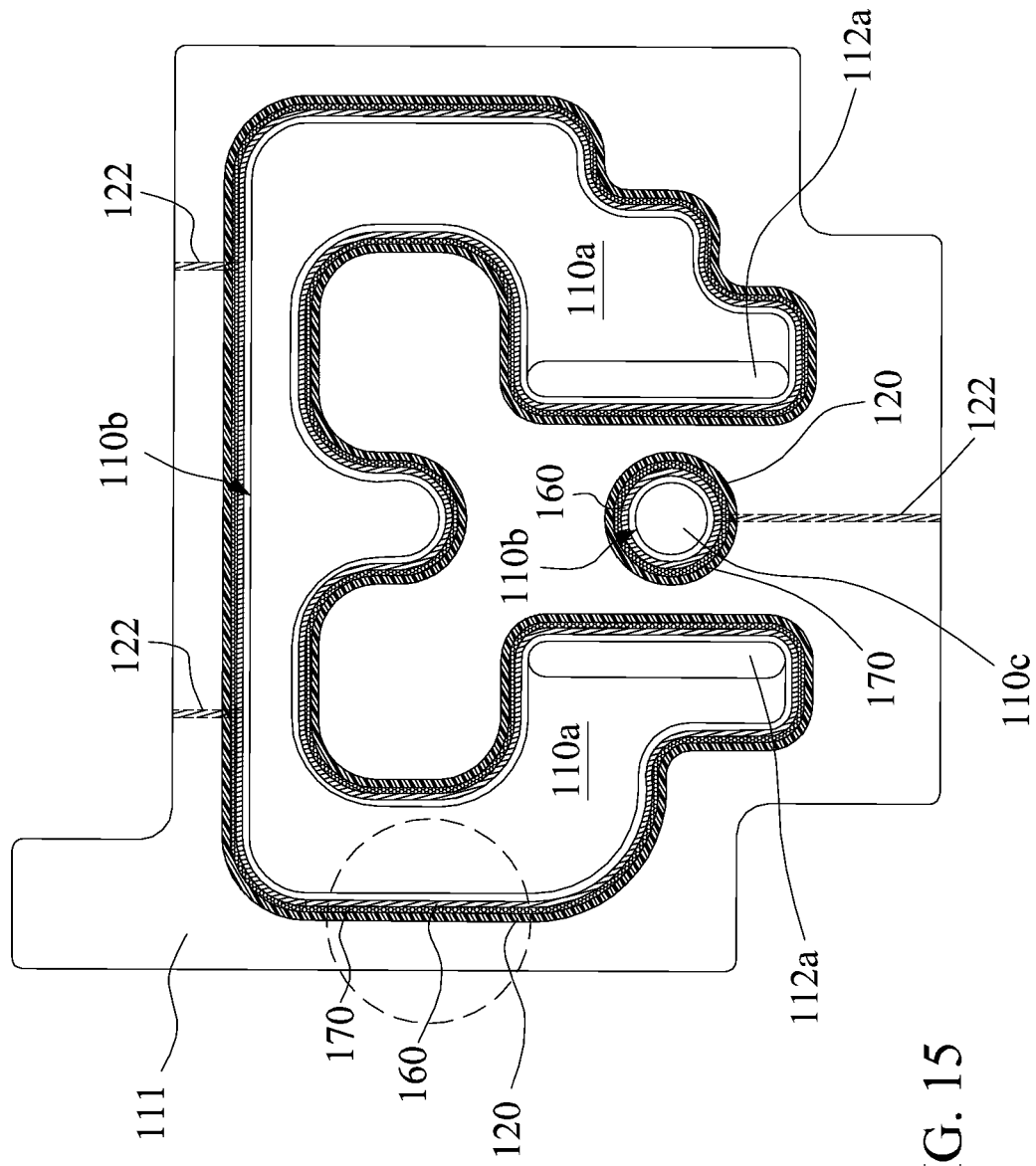
FIG. 15 is a top view of the first insulator according to an eighth embodiment of this disclosure.
Figure 16:
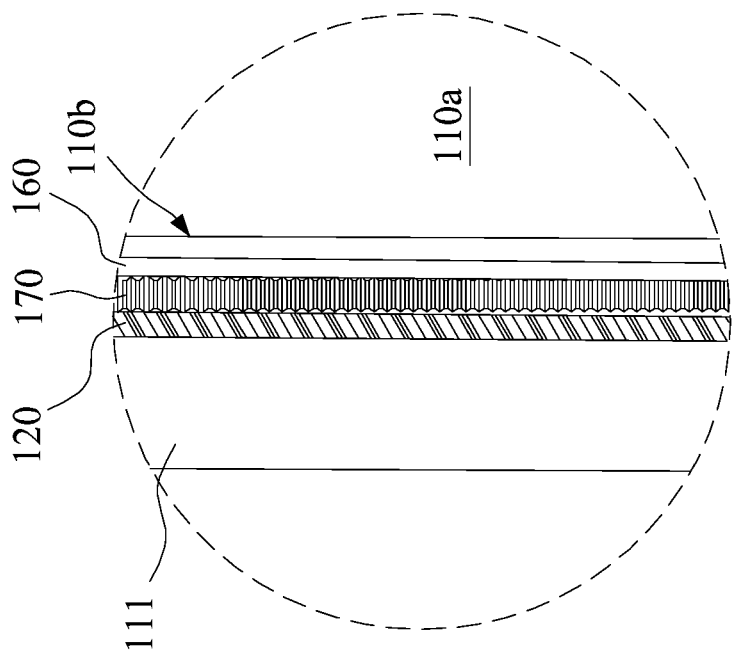
FIG. 16 is a partial top view of the first insulator according to the eighth embodiment of this disclosure.

Referring to FIG. 15 and FIG. 16, which is a liquid cooling device 100 according to an eighth embodiment of this disclosure. The liquid cooling device 100 includes at least one liquid cooling conductor 110, a detecting probe 120, a sealing member 160, and a capillary structure 170.

The eighth embodiment is substantially the same as fifth embodiment, and the differences are described below.

As shown in FIG. 15 and FIG. 16, in the eighth embodiment the detecting probe 120 is spaced from the sealing member 160. The capillary structure 170 is disposed between the detecting probe 120 and the sealing member 16. In the eight embodiments, the detecting probe 120 is disposed around the sealing member 160 and the seam 110b, and the capillary structure 170 is also disposed around the sealing member 160 and the seam 110b. If the detecting probe 120 is partially disposed as shown in FIG. 12, the capillary structure 170 can be also partially disposed, and the length of the capillary structure 170 is approximately equaled to the length of the detecting probe 120.

As shown in FIG. 15 and FIG. 16, the capillary structure 170 can be made of absorbent material, such as foam, sponge, fiber sheet, porous material. When the sealing member 160 is aged and the coolant leaks through the sealing member 160, the coolant would be immediately absorbed by the capillary structure 170. At least partial section of the capillary structure 170 would be wetted completely by the coolant, so as to prevent the leaking coolant from forming a droplet due to cohesive force to cut off the connection with the coolant in the chamber 110a. The completely wetted capillary structure 170 contacts the detecting probe 120, such that detecting probe 120 and the metal conductor 112 are electrically connected through the coolant. In this case, with the circuit of FIG. 3 or other detecting means for determining whether the detecting probe 120 and the metal conductor 112 are electrically connected, the liquid leakage alarm is immediately generated, and the operation of the circulation device 200 is stopped, thereby avoiding the damage of liquid leakage to the computer system.

Figure 17:
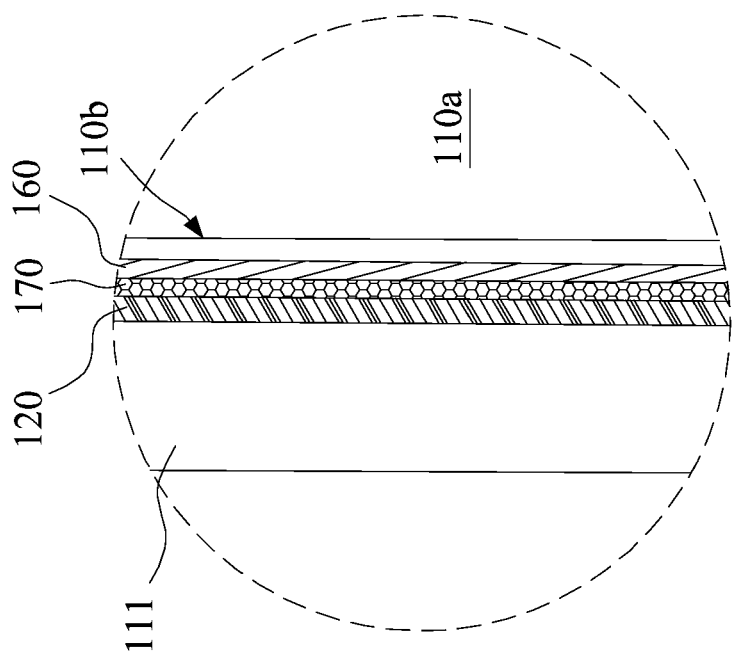
FIG. 17 is a partial top view of the first insulator according to a ninth embodiment of this disclosure.

Referring to FIG. 17, which is a partial top view of the first insulator 111 according to a ninth embodiment of this disclosure. The ninth embodiment is substantially the same as the eighth embodiment, and the differences are described below. In the ninth embodiment, the capillary structure 170 is a surface structure formed on surface of the insulator (the first insulator 111 or the second insulator 113. The surface structure included a plurality of micro grooves extending from the sealing member 160 to the detecting probe 120. The surface structure would be wetted completely by the coolant, so as to prevent the leaking coolant from forming a droplet due to cohesive force to cut off the connection with the coolant in the chamber 110a. Regardless the sealing member 160 is directly attached on the insulator (the surface of the first insulator 111 or the second insulator 113) or embedded into the groove on the surface of the insulator, the sealing member 160 will protrude on the surface of the insulator, and must has a height higher than the height of the surface structure. When the sealing member 160 is compressed to seal the chamber 110a, the height of the sealing member 160 is still higher than that of the surface structure, so as to prevent from being unable to be compressed due to a high surface structure.

Figure 18:
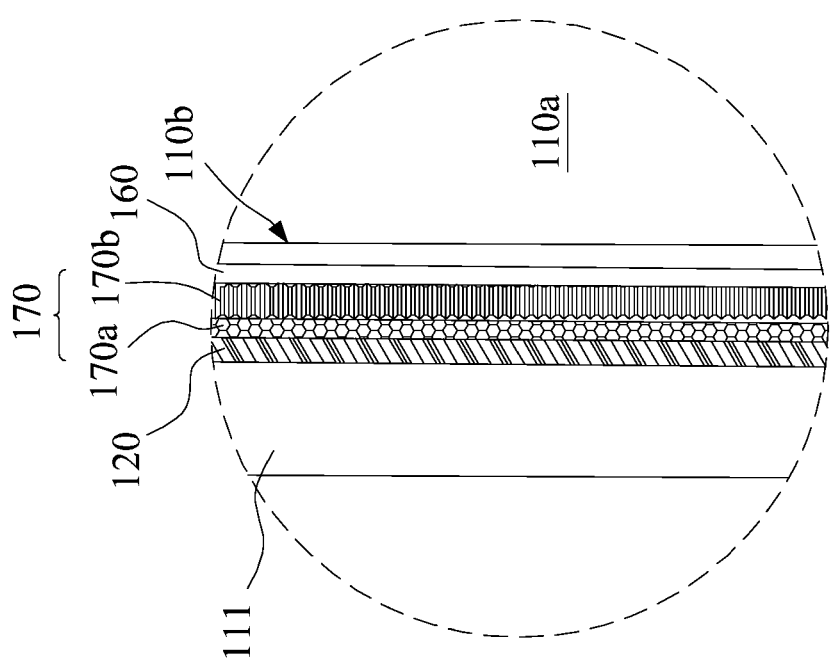
FIG. 18 is a partial top view of the first insulator according to a tenth embodiment of this disclosure.

Referring to FIG. 18, which is a partial top view of a first insulator 111 according to a tenth embodiment of this disclosure. The tenth embodiment is substantially the same as the ninth embodiment, and the differences are described below. In tenth embodiment, the capillary structure 170 includes an absorbent material 170a and a surface structure 170b formed on a surface of the insulator, for example, a plurality micro grooves disposed beside the sealing member 160 and a sponge disposed beside the detecting probe 120, so as to lead the leaking coolant to contact the detecting probe 120.

Figure 19:
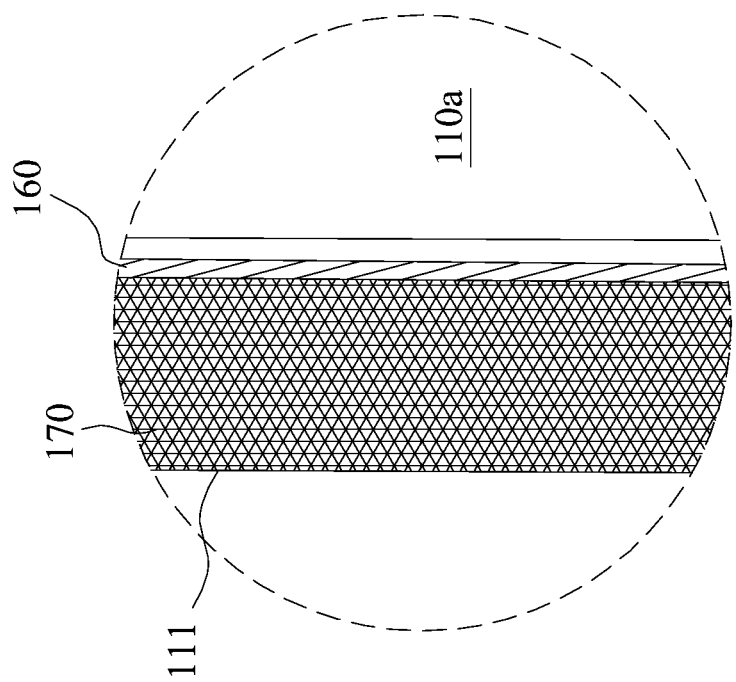
FIG. 19 and FIG. 20 are partial top views of the first insulator according to a eleventh embodiment of this disclosure.
Figure 20:
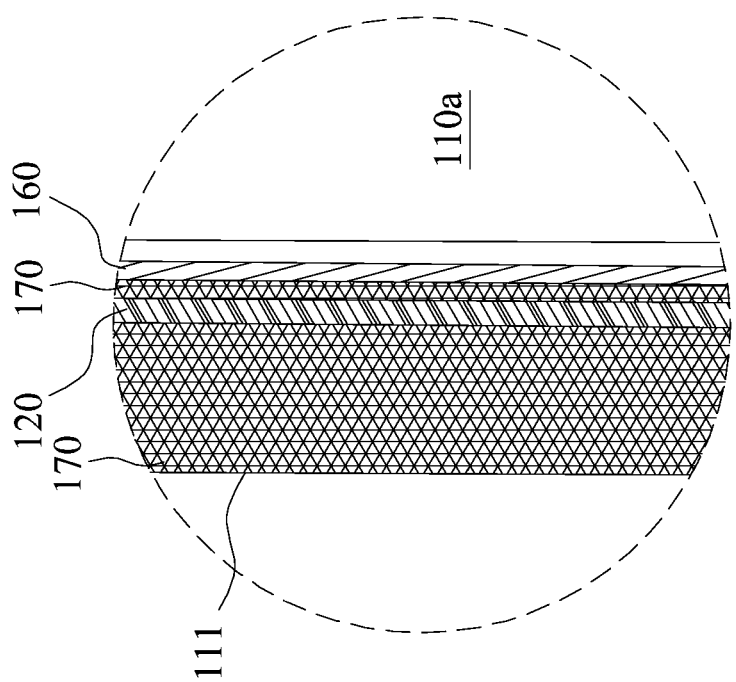

Referring to FIGS. 19 and 20, which is a partial top view of the first insulator 111 according to an eleventh embodiment of this disclosure. The eleventh embodiment is substantially the same as the eighth embodiment, and the differences are described below. In the eleventh embodiment, the capillary structure 170 is a surface structure formed on the surface of the (the first insulator 111 or the second insulator 113), and covers the surface of the insulator excepting the part disposing the sealing member 160.

As shown in FIG. 19, the surface structure is hairline texture formed by hairline surfaced treatment. And the hairline texture at least includes two sets of directional interleaving hairlines, so as to make leaking coolant diffusing on the surface structure well.

As shown in FIG. 20, the detecting probe 120 may be directly attached on the surface structure, and contact or be spaced from the sealing member 160. In the eleventh embodiment, the surface structure occupies most of the surface of the insulator (the insulator 111 or the second insulator 113) instead of being disposed within the narrow gap of the sealing member 160 and the detecting probe 120. The surface structure occupying large area of the surface can reduce treatment difficulty and tolerance in assembly. Meanwhile surface structure occupying large area of the surface can absorb more leaking coolant to prevent the leaking coolant from dropping down.

Figure 21:
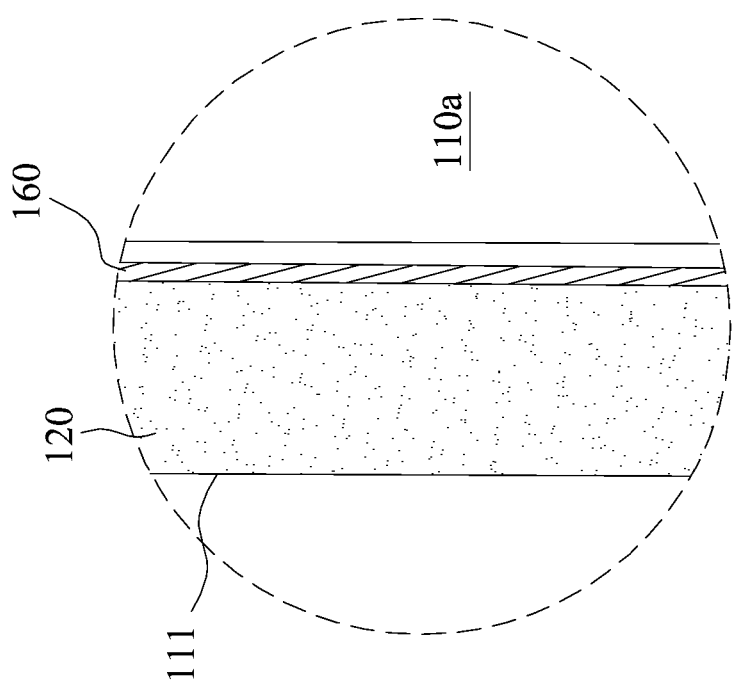
FIG. 21 is a partial top view of the first insulator according to a twelfth embodiment of this disclosure.

Referring to FIG. 21, which is a partial top view of the first insulator 111 according to a twelfth embodiment of this disclosure. In the twelfth embodiment, the detecting probe 120 is disposed on the surface of the insulator (the first insulator 111 or the second insulator 113), and covers the surface of the insulator excepting the part disposing the sealing member 160. Meanwhile, the detecting probe 120 is configured in to capillary structure. For example, graphite is printed on the surface of the insulator by screen printing, to form the detecting probe 120. Therefore, the detecting probe 120 itself is the capillary structure to absorb the leaking coolant well, so as to prevent the leaking coolant from forming a droplet due to cohesive force to cut off the connection with the coolant in the chamber 110a. Providing that the detecting probe 120 is a capillary structure occupying large area of the surface, the manufacturing process of the detecting probe 120 can be simplified, and the detecting probe 120 can absorb the leaking coolant well.

Figure 22:
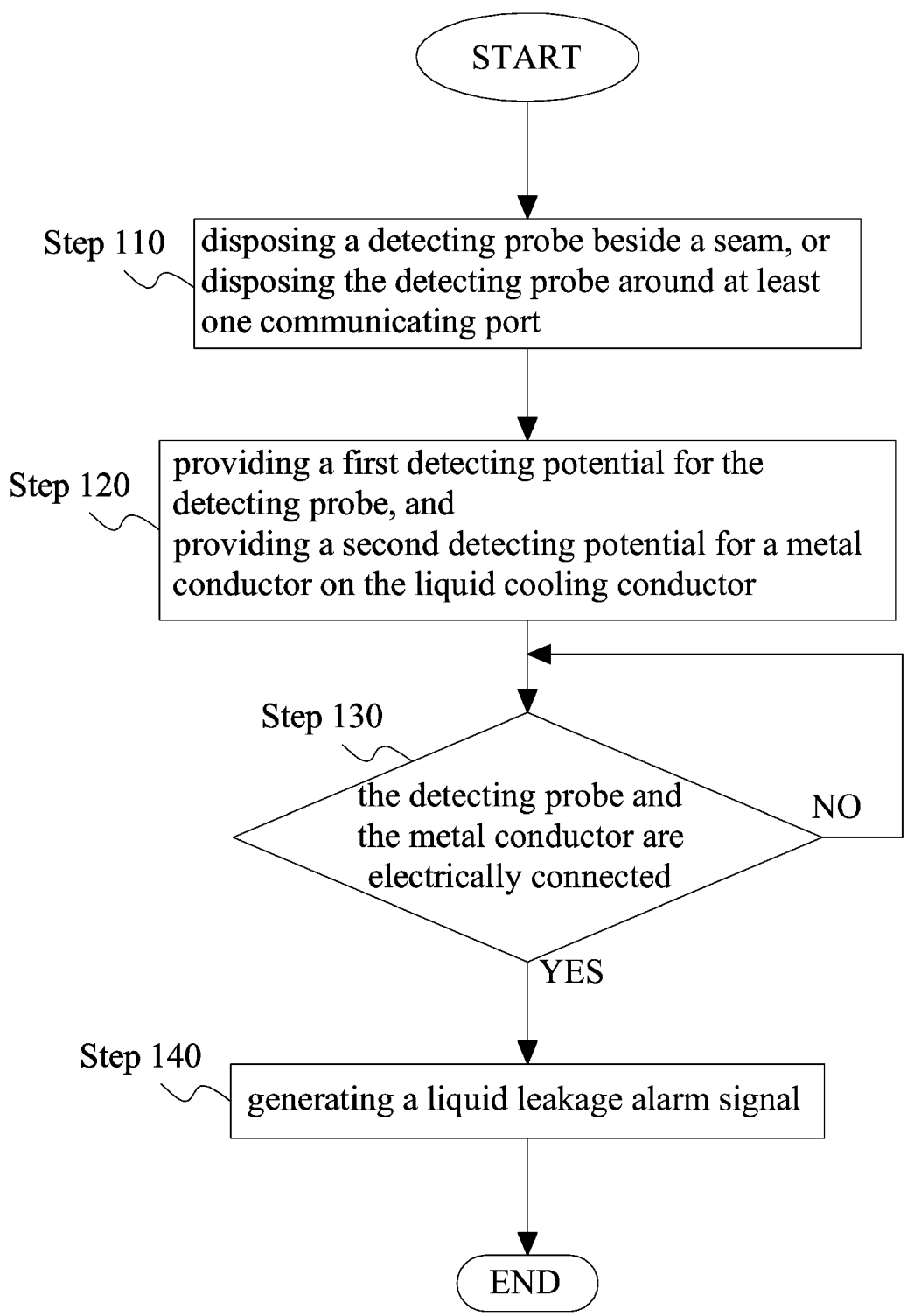
FIG. 22 is a flow chart of a liquid leakage detecting method according to this disclosure.

Referring to FIG. 22, based on the above combination, this disclosure further provides a liquid leakage detecting method for a liquid cooling conductor 110, including the following steps.

As shown in Step 110, first, a detecting probe 120 is provided, and the detecting probe 120 is disposed beside a seam 110b or disposed around at least one communicating port 110c, wherein the seam 110b is formed on a liquid cooling conductor 110 by joining at least two combination blocks, and the communicating port 110c communicates with the interior of the liquid cooling conductor 110. The liquid cooling conductor 110 is not limited to being formed by joining two combination blocks, and may be formed by joining three combination blocks as in Embodiments 5 to 7.

The detecting probe 120 needs to be normally electrically insulated from a metal conductor 112 of the liquid cooling conductor 110. If the liquid cooling conductor 110 includes an insulator 114 portion, the detecting probe 120 is disposed on the insulator 114. If the liquid cooling conductor 110 is entirely composed of the metal conductor 112, or the detecting probe 120 needs to be disposed on the metal conductor 112 such that the detecting probe 120 is located below the seam 110b in the direction of gravity, an insulating patch 140 is first attached to the metal conductor 112, and then the detecting probe 120 is attached to the insulating patch 140. Further, as in Embodiment 5, a sealing member 160 may be provided, which surrounds the seam 110b or the communicating port 110c, and is located inside the detecting probe 120. Alternatively, as in Embodiment 6 and Embodiment 7, another sealing member 160, 160a is provided, which surrounds the seam 110b or the communicating port 110c, and is located outside the detecting probe 120. The another sealing member 160, 160a can be replaced with a conductive rubber ring as a backup means of the detecting probe 120.

As shown in Step 120, a first detecting potential V1 is provided for the detecting probe 120, and a second detecting potential V2 is provided for the metal conductor 112. Generally, the second detecting potential V2 may be a ground potential. That is, the metal conductor 112 is grounded. When the conductive rubber ring is disposed outside the detecting probe 120, the first detecting potential V1 is also provided for the conductive rubber ring. The first detecting potential V1 is provided for the conductive rubber ring by means of directly communicating the detecting probe 120 with a line; for example, the detecting probe 120 is fabricated by printing a conductive paint and extends to form a wire segment 122, and the conductive rubber ring contacts the wire segment 122. Alternatively, a separate wire segment 122 is fabricated by printing a conductive paint, the conductive rubber ring contacts the wire segment 122, and the wire segment 122 is connected to a supply source of the first detecting potential V1.

As shown in Step 130, whether the detecting probe 120 and the metal conductor 112 are conducted is judged by measuring the current between the detecting probe 120 and the metal conductor 112 or by other detecting means.

As shown in Step 140, when the detecting probe 120 and the metal conductor 112 are conducted, a liquid leakage alarm signal is generated to drive an alarm 150 to shut down a liquid pump 220, or is sent to the motherboard to warn the user through an operating system.

According to this disclosure, the detecting probe 120 and the metal conductor 112 of the liquid cooling conductor 110 are used as liquid leakage probes, and a relatively simple trigger circuit can be used as the determining circuit 130, so that the liquid leakage alarm function can be integrated into a part of the existing liquid cooling device 100, without a complicated detecting system or changing of the structure of the liquid cooling conductor 110. In addition, the liquid leakage alarm signal can be used for shutting down the liquid pump 220 in real time to avoid the continuous occurrence of leakage from destroying surrounding electronic components, and real-time intervention of a user is not required, so that this disclosure has a liquid leakage protection function.

What is claimed is:

1. A liquid cooling device, comprising:
   a liquid cooling conductor, including a chamber defined therein for communicating with outside, the chamber being configured to accommodate a coolant, and the surface of the liquid cooling conductor being provided with at least one communicating port communicating with the chamber; wherein the liquid cooling conductor is formed by joining at least two combination blocks, at least one of the at least two combination blocks is a metal conductor, and at least a part of the metal conductor is exposed in the chamber and configured to contact the coolant flowing in the chamber;
   a detecting probe, disposed on the liquid cooling conductor and normally electrically disconnected from the metal conductor; and
   a determining circuit, electrically connected to the metal conductor and the detecting probe, and generating a liquid leakage alarm signal when the metal conductor and the detecting probe are electrically connected;
   wherein one of the at least two combination blocks is the metal conductor, the other combination block is an insulator, and the detecting probe is disposed on the insulator without contacting the metal conductor; or the at least two combination blocks are metal conductors, and the liquid cooling device further comprises an insulating patch attached to one of the metal conductors, and the detecting probe is attached to the insulating patch;
   wherein a seam is formed between the at least two combination blocks, and the detecting probe is disposed beside the seam; or the detecting probe surrounds the at least one communicating port;
   wherein a sealing member surrounds the seam or the communicating port and located inside the detecting probe, another sealing member surrounds the seam or the communicating port and located outside the detecting probe, the another sealing member is a conductive rubber ring and the conductive rubber ring is electrically connected to the detecting probe.

2. The liquid cooling device as claimed in claim 1, further comprising a capillary structure, disposed between the detecting probe and the sealing member.

3. The liquid cooling device as claimed in claim 2, wherein the capillary structure is made of absorbent material.

4. The liquid cooling device as claimed in claim 2, wherein the capillary structure is surface structure formed on a surface of the insulator.

5. The liquid cooling device as claimed in claim 4, wherein the surface structure covers the surface of the insulator at the part disposing the sealing member.

6. The liquid cooling device as claimed in claim 5, wherein the surface structure is hairline texture, and at least includes two sets of directional interleaving hairlines.

7. The liquid cooling device as claimed in claim 5, wherein the detecting probe is attached on the surface structure.

8. The liquid cooling device as claimed in claim 2, wherein the capillary structure includes absorbent material and a surface structure formed on a surface of the insulator.

9. The liquid cooling device as claimed in claim 1, wherein the detecting probe is configured into a capillary structure, and the detecting probe covers the surface of the insulator at the part disposing the sealing member.

10. A liquid cooling device, comprising:
    a liquid cooling conductor, including a chamber defined therein for communicating with outside, the chamber being configured to accommodate a coolant, and the surface of the liquid cooling conductor being provided with at least one communicating port communicating with the chamber; wherein the liquid cooling conductor is formed by joining at least three combination blocks, and the three combination blocks comprise at least one metal conductor, a first insulator and a second insulator, and at least a part of the metal conductor is exposed in the chamber and configured to contact the coolant flowing in the chamber; the first insulator includes a through hole and a first trough, the first trough is located on a first side of the first insulator, and the through hole communicates with the first trough and a second side of the first insulator; the second insulator is joined to the first side of the first insulator to cover the first trough; and the metal conductor is joined to the second side of the first insulator to cover the through hole, so that the first trough and the through hole are sealed to form the chamber;

a detecting probe, disposed on the liquid cooling conductor and normally electrically disconnected from the metal conductor; and a determining circuit, electrically connected to the metal conductor and the detecting probe, and generating a liquid leakage alarm signal when the metal conductor and the detecting probe are electrically connected;

wherein a seam is formed between the at least two combination blocks, and the detecting probe is disposed beside the seam; or the detecting probe surrounds the at least one communicating port.

11. The liquid cooling device as claimed in claim 10, wherein a second trough is formed on a side of the second insulator facing the first trough to increase the volume of the chamber.

12. The liquid cooling device as claimed in claim 10, wherein the communicating port extends from the outer surface of the second insulator to the second trough and communicates with the chamber through the second trough; or the communicating port penetrates the solid portions of the first insulator and the second insulator from the outer surface of the second insulator to be communicated to the second side of the first insulator.

13. The liquid cooling device as claimed in claim 12, wherein the second side of the first insulator is provided with a fourth trough corresponding to the communicating port.

14. The liquid cooling device as claimed in claim 10, wherein the metal conductor further comprises a third trough, the metal conductor is joined to the second side of the first insulator, and the third trough faces the through hole.

15. A coolant circulation system, comprising:
the liquid cooling device according to claim 1;
a liquid pump, connected to the at least one communicating port by a pipe; and
a driving circuit, electrically connected to the liquid pump and the determining circuit for driving the liquid pump, and shutting down the liquid pump when receiving the liquid leakage alarm signal from the determining circuit.

16. The coolant circulation system as claimed in claim 15, further comprising a reservoir, wherein the liquid pump is connected to the communicating port and the reservoir by the pipe.

17. The coolant circulation system as claimed in claim 15, further comprising an alarm electrically connected to the determining circuit, and the alarm receives the liquid leakage alarm signal to generate a corresponding alarm message.

18. A liquid leakage detecting method, comprising:
providing a liquid cooling conductor forming a chamber by joining at least two combination blocks; wherein a seam is formed between the at least two combination blocks, at least one of the at least two combination blocks is a metal conductor, and at least a part of the metal conductor is exposed in the chamber and configured to contact a coolant flowing in the chamber;

disposing a detecting probe beside the seam, or disposing the detecting probe around at least one communicating port communicating with the chamber formed interior of the liquid cooling conductor, wherein one of the at least two combination blocks is a metal conductor, the other combination block is an insulator, and the detecting probe is disposed on the insulator without contacting the metal conductor; or the at least two combination blocks are metal conductors, and the liquid cooling device further comprises an insulating patch attached to one of the metal conductors, and the detecting probe is attached to the insulating patch;

providing a first detecting potential for the detecting probe, and providing a second detecting potential for the metal conductor on the liquid cooling conductor; and determining whether the detecting probe and the metal conductor are electrically connected, and generating a liquid leakage alarm signal when the detecting probe and the metal conductor are electrically connected, wherein a sealing member surrounds the seam or the communicating port and located inside the detecting probe, another sealing member surrounds the seam or the communicating port and located outside the detecting probe, the another sealing member is a conductive rubber ring and the conductive rubber ring is electrically connected to the detecting probe.

* * * * *